(12) United States Patent
Oshima et al.

(10) Patent No.: US 12,713,723 B2
(45) Date of Patent: Aug. 18, 2026

(54) SOLID-STATE IMAGE SENSOR AND METHOD FOR PRODUCING THE SAME

(71) Applicant: TOPPAN Inc., Taito-ku (JP)

(72) Inventors: Norihiko Oshima, Taito-ku (JP); Wataru Nozaki, Taito-ku (JP)

(73) Assignee: TOPPAN Inc., Taito-ku (JP)

( * ) Notice: Subject to any disclaimer, the term of this patent is extended or adjusted under 35 U.S.C. 154(b) by 461 days.

(21) Appl. No.: 18/320,504

(22) Filed: May 19, 2023

(65) Prior Publication Data

US 2023/0290798 A1 Sep. 14, 2023

Related U.S. Application Data

(63) Continuation of application No. PCT/JP2021/045609, filed on Dec. 10, 2021.

(30) Foreign Application Priority Data

Dec. 10, 2020 (JP) ................................ 2020-204965

(51) Int. Cl.
*H01L 27/146* (2006.01)
*H10F 39/00* (2025.01)

(52) U.S. Cl.
CPC ....... *H10F 39/8053* (2025.01); *H10F 39/024* (2025.01); *H10F 39/805* (2025.01); *H10F 39/8057* (2025.01); *H10F 39/8063* (2025.01)

(58) Field of Classification Search
CPC . H10F 39/8053; H10F 39/805; H10F 39/8063
(Continued)

(56) References Cited

U.S. PATENT DOCUMENTS

2006/0202295 A1 9/2006 Wu et al.
2007/0200056 A1* 8/2007 Kim .................... H10F 39/8053 250/214.1
(Continued)

FOREIGN PATENT DOCUMENTS

JP 2000-164836 A 6/2000
JP 2013-12518 A 1/2013
(Continued)

OTHER PUBLICATIONS

International Search Report issued Mar. 15, 2022 in International Application No. PCT/JP2021/045609 filed Dec. 12, 2021, 5 pages (with English Translation).
(Continued)

*Primary Examiner* — Dzung Tran
(74) *Attorney, Agent, or Firm* — Oblon, McClelland, Maier & Neustadt, L.L.P.

(57) ABSTRACT

A solid-state image sensor includes a substrate, photoelectric conversion elements positioned on the substrate, a filter module positioned above the photoelectric conversion elements positioned on the substrate, lenses positioned above the filter module positioned above the photoelectric conversion elements, a resin layer formed such that the resin layer is surrounding an outer edge of the filter module positioned on the substrate, and an anti-reflection film formed on the lenses and resin layer such that the anti-reflection film has a peripheral film portion covering a peripheral portion of the resin layer. The filter module is positioned such that light is transmitted through the filter module before being incident on the photoelectric conversion elements, and the anti-reflection film is formed such that the peripheral film portion has an uneven shape having unevenness in thickness direction of the resin layer and at least part of an outer edge protruding outside the resin layer.

19 Claims, 11 Drawing Sheets

(58) Field of Classification Search
USPC .......................................................... 257/432
See application file for complete search history.

(56) References Cited

U.S. PATENT DOCUMENTS

| | | | | |
|---|---|---|---|---|
| 2009/0302406 | A1* | 12/2009 | Gambino | H10F 39/026 438/70 |
| 2012/0068294 | A1* | 3/2012 | Lee | H10F 39/8057 257/431 |
| 2014/0217538 | A1* | 8/2014 | Shimotsusa | H10F 39/8063 257/432 |
| 2018/0358396 | A1 | 12/2018 | Huang et al. | |

FOREIGN PATENT DOCUMENTS

| | | | |
|---|---|---|---|
| JP | 2013-131613 | A | 7/2013 |
| JP | 2014-103299 | A | 6/2014 |
| JP | 2018-045135 | A | 3/2018 |
| JP | 2018-207086 | A | 12/2018 |

OTHER PUBLICATIONS

Japanese Notification of Reasons for Rejection issued May 14, 2024 in Japanese Application No. 2022-548115 with English translation, 18 pgs.

* cited by examiner 1
4
A3
25a
A2b
A2
A2a
E
F6
F6
8e (8d)
37
8 (8d)
15a
8 (8c)
27

FIG.6

SOLID-STATE IMAGE SENSOR AND METHOD FOR PRODUCING THE SAME

CROSS-REFERENCE TO RELATED APPLICATIONS

The present application is a continuation of and claims the benefit of priority to International Application No. PCT/JP2021/045609, filed Dec. 10, 2021, which is based upon and claims the benefit of priority to Japanese Application No. 2020-204965, filed Dec. 10, 2020. The entire contents of these applications are incorporated herein by reference.

BACKGROUND OF THE INVENTION

Field of the Invention

The present invention relates to a solid-state image sensor and a method for producing the same.

Description of Background Art

JP 2013-012518 A proposes a technique of providing a solid-state image sensor with projections composed of the same material as its microlenses such that the projections are disposed in an adjacent region adjoining a light-receiving effective region so as to surround this region and forming an anti-reflection film that uniformly covers the surfaces of the microlenses and projections. The entire contents of this publication are incorporated herein by reference.

SUMMARY OF THE INVENTION

According to one aspect of the present invention, a solid-state image sensor includes a substrate, photoelectric conversion elements positioned on the substrate, a filter module positioned above the photoelectric conversion elements positioned on the substrate, lenses positioned above the filter module positioned above the photoelectric conversion elements, a resin layer formed such that the resin layer is surrounding an outer edge of the filter module positioned on the substrate, and an anti-reflection film formed on the lenses and the resin layer such that the anti-reflection film has a peripheral film portion covering a peripheral portion of the resin layer. The filter module is positioned such that light is transmitted through the filter module before being incident on the photoelectric conversion elements, and the anti-reflection film is formed such that the peripheral film portion has an uneven shape having unevenness in a thickness direction of the resin layer and at least part of an outer edge protruding outside the resin layer.

According to another one aspect of the present invention, a method for producing a solid-state image sensor includes preparing a substrate having photoelectric conversion elements, forming a filter module above the photoelectric conversion elements such that the filter module covers the photoelectric conversion elements, forming a resin layer such that that the resin layer surrounds an outer edge of the filter module, patterning the resin layer such that a surface of the resin layer has an uneven shape having unevenness in a thickness direction of the resin layer, forming an anti-reflection film on a surface of the patterned resin layer; and etching the uneven shape entirely around peripheries of the anti-reflection film and the resin layer such that the anti-reflection film and the resin layer are partially removed and part of the anti-reflection film protrudes outside the resin layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a cross-sectional view taken along line F6-F6 in FIG. 5;

DETAILED DESCRIPTION OF THE EMBODIMENTS

Figure 1:
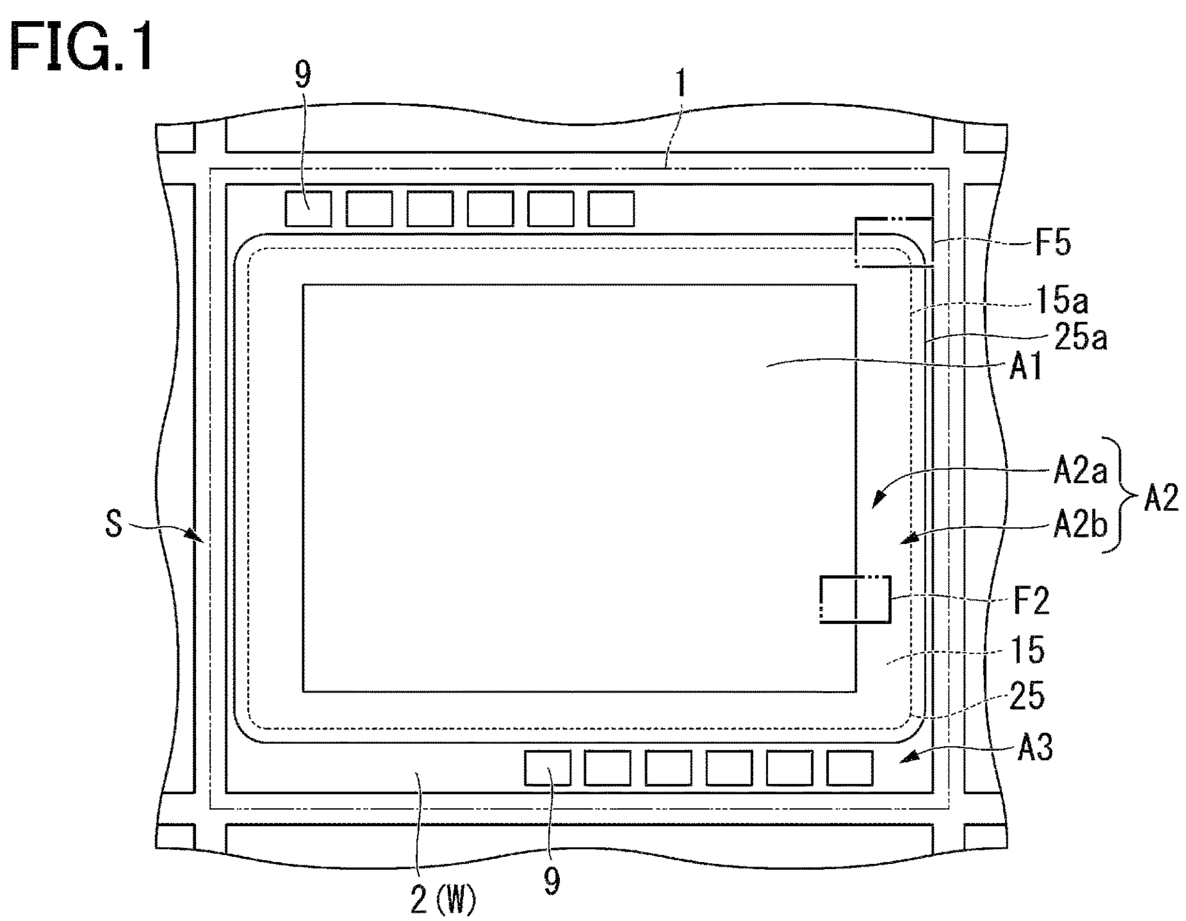
FIG. 1 is a schematic plan view illustrating an example of a solid-state image sensor according to an embodiment of the present invention.

Embodiments will now be described with reference to the accompanying drawings, wherein like reference numerals designate corresponding or identical elements throughout the various drawings.

A solid-state image sensor according to an embodiment of the present invention and a method according to this embodiment for producing the same will be described.

FIG. 1 is a schematic plan view illustrating an example of a solid-state image sensor according to an embodiment of the present invention.

As illustrated in FIG. 1, solid-state image sensors 1 of the present embodiment are formed on a silicon wafer W by a semiconductor manufacturing process. The solid-state image sensors 1 each have a rectangular shape in plan view such that they are bounded by respective scribe lines S formed in a rectangular grid pattern. Each solid-state image sensor 1 is cut along the respective scribe line S and packaged. The individual silicon wafers W cut along the respective scribe lines S are hereinafter referred to as a semiconductor substrate 2. Note that in the description of the production method, the silicon wafer W may be referred to as a semiconductor substrate 2 for description of the individual solid-state image sensors 1.

The semiconductor substrate 2 has a rectangular shape in plan view. Here, the term "in plan view" refers to viewing the semiconductor substrate 2 in its thickness direction.

The solid-state image sensor 1 is any area sensor that can capture color images. For example, the solid-state image sensor 1 may be a CCD or CMOS sensor.

The solid-state image sensor 1 includes a light-receiving effective region A1, a surrounding light-shielding region A2, and a substrate peripheral region A3 on the semiconductor substrate 2.

The light-receiving effective region A1 has a rectangular shape in plan view with imaging pixels formed therein. The light-receiving effective region A1 is disposed at the center of the semiconductor substrate 2.

The surrounding light-shielding region A2 is a region having a rectangular frame shape and disposed adjacent to the outer edge of the light-receiving effective region A1 so as to surround the entire outer edge. The surrounding light-shielding region A2 includes layer members that block external incident light and reflected external light. The surrounding light-shielding region A2 is composed of an inner section A2*a* adjacent to the light-receiving effective region A1, and an outer section A2*b* including the outer edge of the surrounding light-shielding region A2.

The substrate peripheral region A3 is bounded by the outer edge of the surrounding light-shielding region A2 and the outer edge of the semiconductor substrate 2. The portion of the semiconductor substrate 2 in the substrate peripheral region A3 has formed thereon metal electrode pads 9 for wiring of the solid-state image sensor 1.

The cross-sectional configurations of the light-receiving effective region A1 and the inner section A2*a* of the surrounding light-shielding region A2 will be described.

Figure 2:
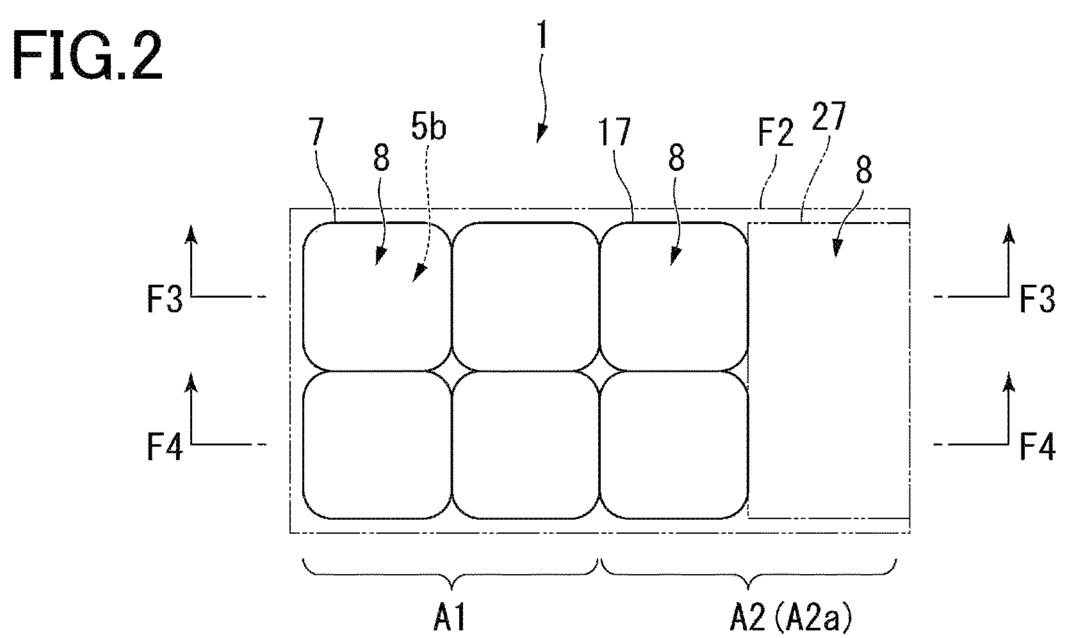
FIG. 2 is an enlarged view of the part F2 shown in FIG. 1.
Figure 3:
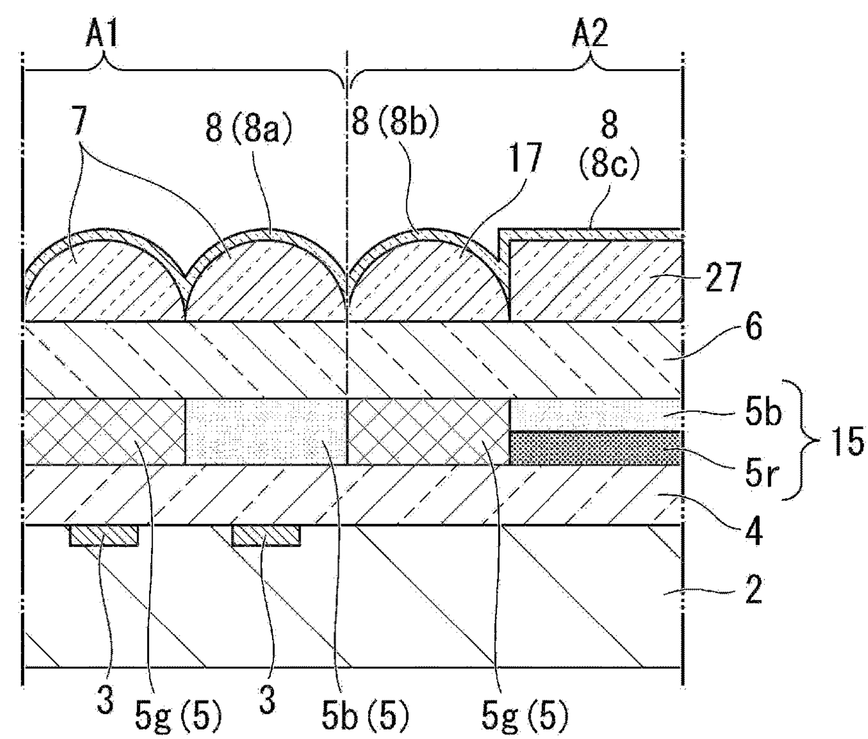
FIG. 3 is a cross-sectional view taken along line F3-F3 in FIG. 2.
Figure 4:
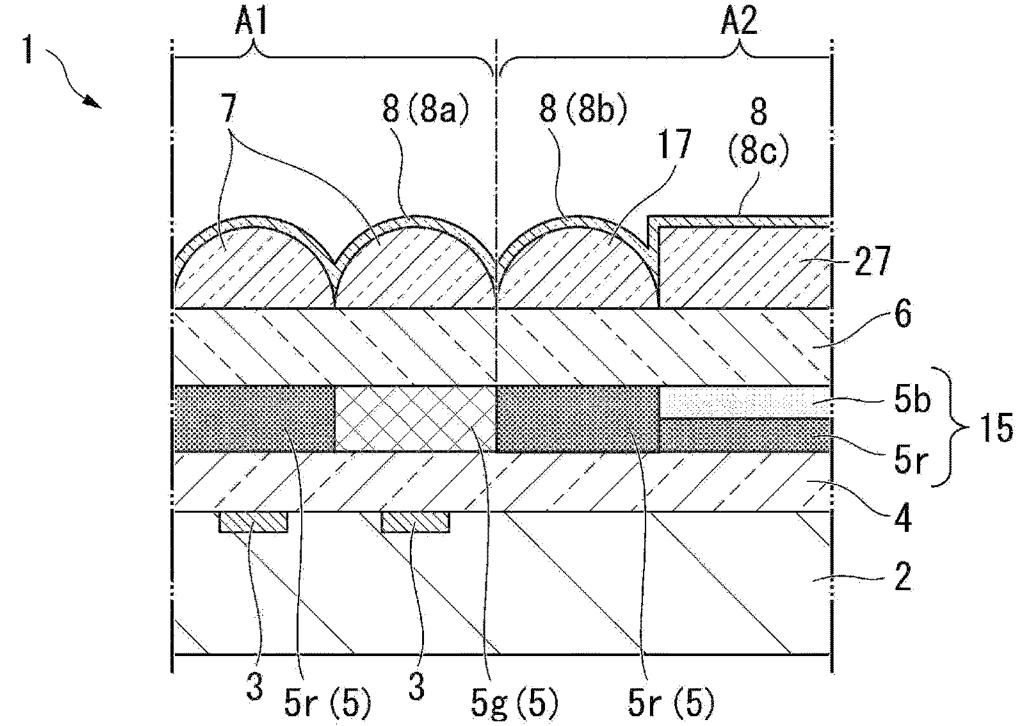
FIG. 4 is a cross-sectional view taken along line F4-F4 in FIG. 2.

FIG. 2 is an enlarged view of the part F2 shown in FIG. 1. FIG. 3 is a cross-sectional view taken along line F3-F3 in FIG. 2. FIG. 4 is a cross-sectional view taken along line F4-F4 in FIG. 2.

As illustrated in FIG. 2, the light-receiving effective region A1 has formed therein lenses 7 provided for respective imaging pixels and used to collecting external light.

Part of the surrounding light-shielding region A2 adjoining the light-receiving effective region A1 has formed therein inner projections 17 adjacent to the lenses 7 and having the same shape as the lenses 7.

In the surrounding light-shielding region A2, a flat resin layer 27 is disposed adjacent to a peripheral side of the inner projections 17 (right side in the drawing).

The inner section A2*a* of the surrounding light-shielding region A2 is a region including the inner projections 17 and the flat resin layer 27 in plan view.

As illustrated in FIG. 3, in the light-receiving effective region A1, the semiconductor substrate 2 has formed thereon photoelectric conversion elements 3, a first flattening layer 4, a filter module 5, a second flattening layer 6, lenses 7, and an anti-reflection film 8 in this order.

The photoelectric conversion elements 3 are each structured to subject incident light to photoelectric conversion and to output an electrical signal based on the amount of the received light. In the present embodiment, a large number of photoelectric conversion elements 3 are positioned in a rectangular grid pattern along the longitudinal and lateral directions of the light-receiving effective region A1 having a rectangular shape in plan view.

The first flattening layer 4 is a transparent resin layer laminated on the semiconductor substrate 2 and the photoelectric conversion elements 3. The first flattening layer 4 evens out the irregularities on the surfaces of the semiconductor substrate 2 and the photoelectric conversion elements 3 and thus forms a flat surface over the semiconductor substrate 2 and the photoelectric conversion elements 3.

The first flattening layer 4 may be formed, for example, by using spin coating to apply a colorless, transparent acrylic resin solution at a thickness of about 0.1 and heat-curing the applied solution.

The filter module 5 is a layer member laminated on the first flattening layer 4 and performs color separation on light incident from outside the solid-state image sensor 1.

For example, the filter module 5 may include red colored layers 5*r* having spectral characteristics of transmitting red light, green colored layers 5*g* having spectral characteristics of transmitting green light, and blue colored layers 5*b* having spectral characteristics of transmitting blue light. Each colored layer of the filter module 5 faces a different one of the photoelectric conversion elements 3 in the thickness direction of the solid-state image sensor 1. The colored layers and the photoelectric conversion elements 3 may not face each other one-to-one. For example, each colored layer may be disposed for a different set of four photoelectric conversion elements.

A known appropriate formation may be used for the respective colored layers of the filter module 5. The following description is provided taking an example where the respective colored layers are formed based on a Bayer pattern.

In the Bayer pattern, for each rectangular block of 2×2 colored layers, one red colored layer 5*r* and one blue colored layer 5*b* are diagonally opposed to each other in a first direction, and two green colored layers 5*g* are diagonally opposed to each other in a second direction perpendicular to the first direction.

Thus, in cross section shown in FIG. 3, the green colored layers 5*g* and blue colored layers 5*b* are alternately formed in a lateral direction in the drawing. In a row of colored layers adjacent to the filter module 5 shown in this cross section, the green colored layers 5*g* and red colored layers 5*r* are alternately formed in a lateral direction in the drawing. The filter module 5 extends to the entire region in which the inner projections 17 are located directly above in the thickness direction.

Note that the red colored layers 5*r*, green colored layers 5*g*, and blue colored layers 5*b* may not be directly adjacent to each other as in the examples of FIGS. 3 and 4. For example, the filter module 5 may be provided by forming a dividing wall in a grid pattern on the first flattening layer 4 and disposing the red colored layers 5*r*, green colored layers 5*g*, and blue colored layers 5*b* in the respective openings on the first flattening layer 4 defined by the inner surfaces of the dividing wall.

The filter module 5 can be provided by forming the red colored layers 5*r*, green colored layers 5*g*, and blue colored layers 5*b* on the first flattening layer 4. A specific colored layer can be formed by using spin coating to apply, to a surface of the first flattening layer 4, a colorant such as a pigment having spectral transmittance characteristics of the specific colored layer and a photosensitive material containing an alkali-soluble resin, patterning the photosensitive material by photolithography involving exposure and development, and curing the resulting material. The red colored layers 5*r*, green colored layers 5*g*, and blue colored layers 5*b* may be formed in any order.

The different colored layers tend to differ from each other in the thickness for achieving a required spectral transmittance. For this reason, the filter module 5 is likely to have microscopic asperities on the surface even if the first flattening layer 4 is flat.

To address this, in the present embodiment, the second flattening layer 6 for evening out the asperities on the surface of the filter module 5 is laminated on the filter module 5 as illustrated in FIGS. 3 and 4. The second flattening layer 6 is a transparent resin layer.

The second flattening layer 6 is composed of any transparent resin material that can form a flat surface.

The lenses 7 focus external light incident on the solid-state image sensor 1 onto the respective photoelectric conversion elements 3. Each lens 7 is disposed on the second flattening layer 6 so as to face the corresponding photoelectric conversion element 3 with the red colored layer 5*r*, green colored layer 5*g*, or blue colored layer 5*b* therebetween. Thus, the lenses 7 are positioned in a rectangular grid pattern at a pitch that matches the pitch of the photoelectric conversion elements 3 positioned in the longitudinal and lateral directions. Although such a pitch may be different in the longitudinal and lateral directions, each pitch in the longitudinal and lateral directions is P in the present embodiment. The pitch P is determined by the pixel density of the solid-state image sensor 1 and not particularly limited.

The lenses 7 each have any convex lens shape that can efficiently focus external light onto the photoelectric conversion element 3.

The lenses 7 are formed of any transparent resin material. Examples of the material of the lenses 7 include acrylics and novolacs.

The material of the lenses 7 may be the same as or different from that of the second flattening layer 6.

For example, the lenses 7 may be produced using any method. For example, the lenses 7 may be produced using a method of a reflow or transfer type.

In the reflow-type method, an acrylic photosensitive resin that serves as the material of the lenses 7 is selectively patterned by photolithography, and then the lens shapes are formed by virtue of thermal reflowability of the material.

In the transfer-type method, an alkali-soluble, photosensitive, and thermally reflowable resist material is used to form a lens mold by photolithography and thermal reflow on a flat layer of an acrylic transparent resin that serves as the material of the lenses 7, and transferring the shapes of the lens mold to the acrylic transparent resin layer by dry etching.

The anti-reflection film 8 is a thin film that reduces reflection at the surfaces of the lenses 7. The anti-reflection film 8 is uniformly formed over the convex surfaces of the lenses 7. The surface of the anti-reflection film 8 has an uneven shape that conforms to that formed by the lenses 7. Note that the lenses 7, inner projections 17, flat resin layer 27, and second flattening layer 6 may be formed of the same material. In this case, the lenses 7, inner projections 17, flat resin layer 27, and second flattening layer 6 are integrally formed and thus have no boundary therebetween. With this configuration, the anti-reflection film 8 is disposed on the lenses 7, inner projections 17, and flat resin layer 27, which are composed of the same material as the second flattening layer 6

The anti-reflection film 8 may be a multilayer or single-layer film. An anti-reflection film 8 having a multilayer structure may be a multilayer anti-reflection film including two or more alternating high refractive index and low refractive index layers.

Examples of the material of the high refractive index layer in the multilayer anti-reflection film include metal oxides such as of titanium, cerium, tantalum, tin, indium, zirconium, and aluminum, and mixtures of these metal oxides. The high refractive index layer may have a refractive index of 1.60 or more.

Examples of the material of the low refractive index layer in the multilayer anti-reflection film include metal oxides such as of magnesium, zirconium, and aluminum, silicon oxides such as silicon dioxide, magnesium fluoride, and mixtures thereof. The refractive index of the low refractive index layer is not particularly limited as long as it is lower than that of the high refractive index layer. For example, the low refractive index layer may have a refractive index of less than 1.60.

The anti-reflection film 8 composed of a single-layer film is formed of a material having a refractive index lower than that of the lens 7. For example, the above-described low refractive index layer may be used as the material of the single-layer film.

For example, a single-layer anti-reflection film 8 with a low visible light reflectance can be formed by depositing a film of silicon dioxide having a refractive index of 1.46 on the surface of the lenses 7 at a thickness of 50 nm or more and 200 nm or less.

The anti-reflection film 8 can be formed by depositing the above inorganic material using a vacuum film deposition technique such as vacuum deposition or sputtering.

Among the thin-film materials that can be used for the anti-reflection film 8, silicon dioxide in particular is more preferably contained in a constituent material of the anti-reflection film 8 because a high-quality thin film of silicon dioxide can be formed at low cost using a vacuum film deposition technique, and optical properties and resistance of a thin film of silicon dioxide are well known.

In the inner section A2*a* of the surrounding light-shielding region A2, the semiconductor substrate 2 has formed thereon the first flattening layer 4, an inner light-shielding layer 15, and the second flattening layer 6 in this order. Part of the second flattening layer 6 in the inner section A2*a* has formed thereon the inner projections 17 and the flat resin layer 27, which have formed thereon the same anti-reflection film 8 as that over the light-receiving effective region A1. Note that the surface shape of the anti-reflection film 8 in the inner section A2*a* conforms to the surface shape of the inner projections 17 and the flat resin layer 27.

The portion of the first flattening layer 4 in the inner section A2*a* is the same layer member as the portion of the first flattening layer 4 in the light-receiving effective region A1 and is contiguous to the portion of the first flattening layer 4 in the light-receiving effective region A1.

The inner light-shielding layer 15 is provided to reduce incident light from an external light source (hereafter "external incident light") and this light reflected off the semiconductor substrate 2 (hereafter "internally reflected light"). As illustrated in FIG. 1, a peripheral surface 15*a* of the inner light-shielding layer 15 in plan view extends near a peripheral surface 25*a* (constituting the outer edge of the surrounding light-shielding region A2) of an outer light-shielding layer (light-blocking layer) 25 described later. The peripheral surface 15*a* in plan view has a substantially rectangular shape with the four rounded corners as with the peripheral surface 25*a* in plan view.

The inner light-shielding layer 15 is not particularly limited as long as it is structured to absorb at least part of the external incident light and the internally reflected light. The inner light-shielding layer 15 may have a single-layer or multilayer structure. For example, a colored layer colored with a colorant of appropriate color may be used for the inner light-shielding layer 15. For example, a black layer colored with a black colorant may be used for the inner light-shielding layer 15.

In the example of FIG. 3, the inner light-shielding layer 15 is composed of the red colored layer 5*r* and blue colored layer 5*b* used in the filter module 5 such that these colored layers are laminated in this order on the first flattening layer 4. The order of lamination is not limited to this, and the blue colored layer 5*b* and red colored layer 5*r* used in the filter module 5 may be laminated in this order on the first flattening layer 4. In this case, the inner light-shielding layer 15 can be formed during production of the blue colored layers 5*b* and red colored layers 5*r* in the filter module 5, which simplifies the production process. Similarly, the inner light-shielding layer 15 may be composed of a combination of two or more colored layers selected from the red colored layer 5*r*, green colored layer 5*g*, and blue colored layer 5*b*. Note that the red colored layer 5*r* and blue colored layer 5*b* are preferably laminated from the viewpoint of more easily providing a dark color due to their transmission wavelength ranges having a larger difference therebetween.

The portion of the second flattening layer 6 in the inner section A2*a* is the same layer member as the portion of the second flattening layer 6 in the light-receiving effective region A1 and is contiguous to the portion of the second flattening layer 6 in the light-receiving effective region A1.

The portion of the second flattening layer 6 in the inner section A2*a* is formed in the same process as that for the portion of the second flattening layer 6 in the light-receiving effective region A1 after formation of the filter module 5 and inner light-shielding layer 15.

The inner projections 17, which are adjacent to the lenses 7 and disposed in the surrounding light-shielding region A2, have the same shape as the lenses 7. The inner projections 17 are formed in the same manner as the lenses 7 using the same material as the lenses 7.

The inner projections 17 are provided to prevent cracking in the lenses 7 at the outer edge of the light-receiving effective region A1.

When the anti-reflection film 8 is formed after formation of the lenses 7, stress within the anti-reflection film 8 is released, which easily causes cracking in the anti-reflection film 8 at the outer edge of the light-receiving effective region A1. With the inner projections 17 disposed adjacent to the outer edge of the light-receiving effective region A1 and having the same shape as the lenses 7, cracking occurring in the anti-reflection film 8 does not proceed further than the region where the inner projections 17 are disposed. Thus, defects in part of the anti-reflection film 8 above the lenses 7 can be reduced.

The inner projections 17 have no optical function such as light-collecting action, and thus cracking in part of the anti-reflection film 8 located over them will not degrade the performance of the solid-state image sensor 1.

The number of inner projections 17 in an outward direction away from the light-receiving effective region A1 is not particularly limited as long as cracking is prevented from entering the light-receiving effective region A1. Although FIGS. 3 and 4 illustrate an example in which the inner projections 17 are provided in a row surrounding the light-receiving effective region A1, the inner projections 17 and colored layers 5 may both be provided in two or more rows.

The flat resin layer 27 is a flat layer member surrounding the opposite side of the inner projections 17 to that facing the light-receiving effective region A1. The flat resin layer 27 is formed of the same material as the lenses 7 and inner projections 17. The thickness of the flat resin layer 27 is not particularly limited, but the flat resin layer 27 may have the same thickness as a layer member applied to the second flattening layer 6 to form the lenses 7 and inner projections 17 and cured.

The configuration of the outer section A2*b* of the surrounding light-shielding region A2 will be described.

Figure 5:
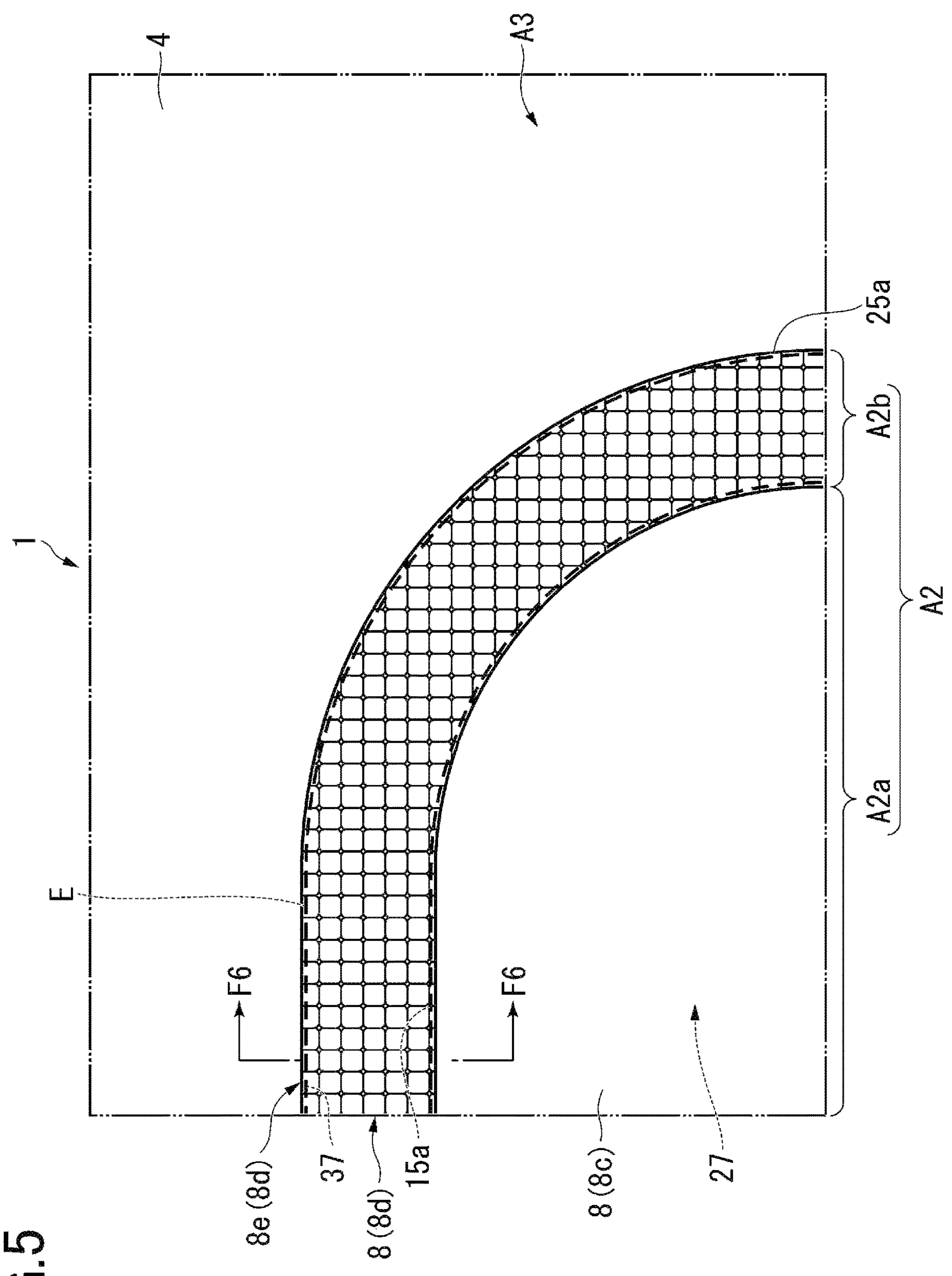
FIG. 5 is an enlarged view of the part F5 shown in FIG. 1.
Figure 6:
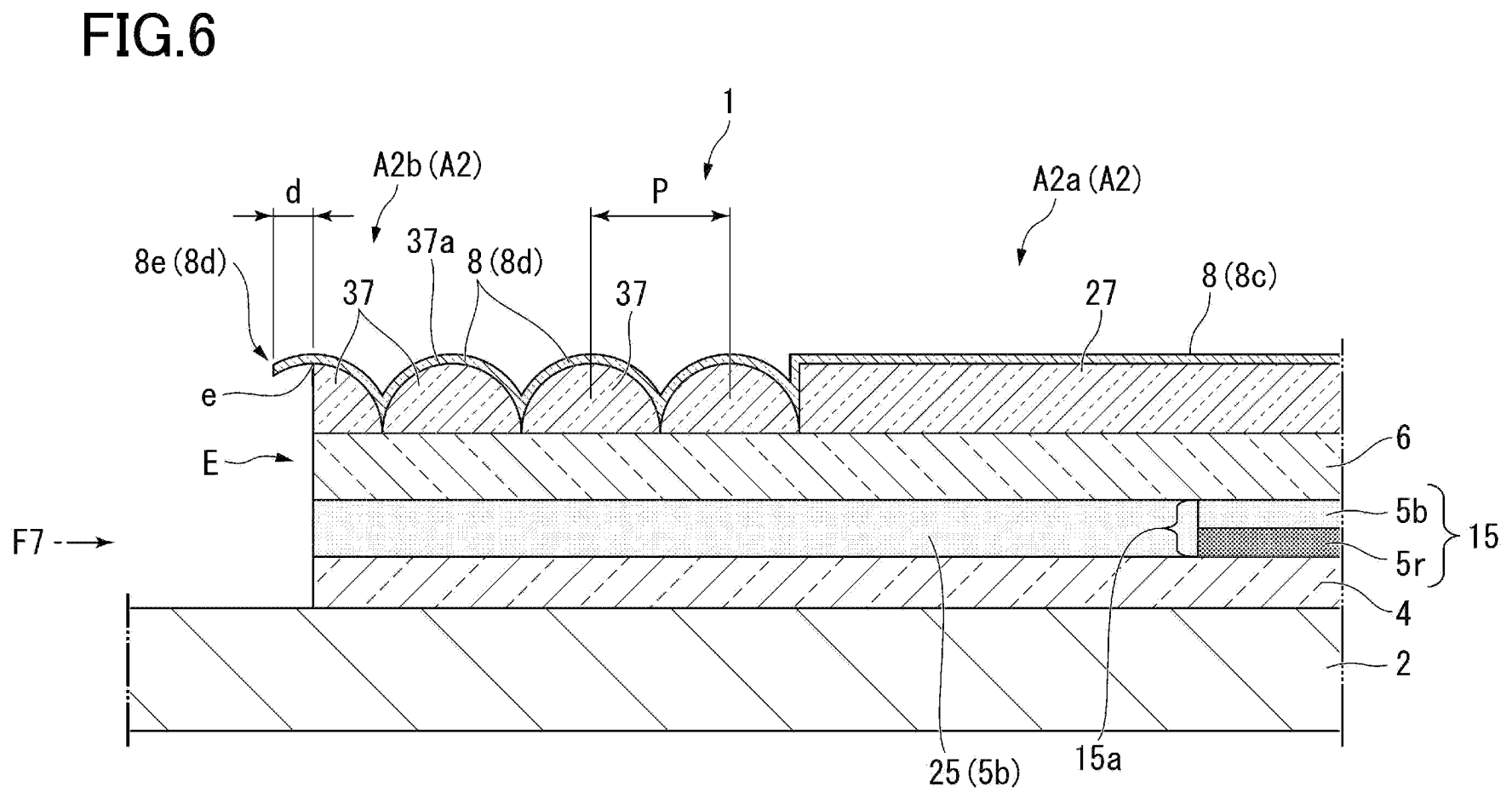
Figure 7:
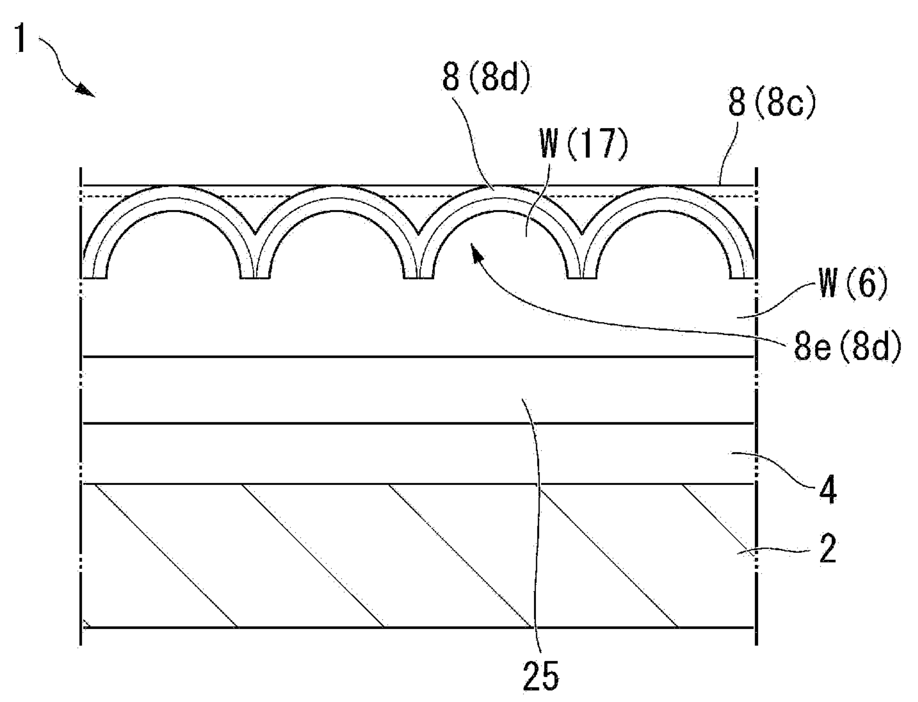
FIG. 7 is a side view as seen in the direction of arrow F7 in FIG. 6.

FIG. 5 is an enlarged view of the part F5 shown in FIG. 1. FIG. 6 is a cross-sectional view taken along line F6-F6 in FIG. 5. FIG. 7 is a side view as seen in the direction of arrow F7 in FIG. 6.

As illustrated in FIG. 5, the outer section A2*b* is formed adjacent to the outer edge of the inner section A2*a*.

In the outer section A2*b* in cross section shown in FIG. 6, the semiconductor substrate 2 has formed thereon the first flattening layer 4, the outer light-shielding layer 25, the second flattening layer 6, outer projections 37 (projecting portions; resin layer), and the anti-reflection film 8 in this order.

Note that part of the inner section A2*a* has formed therein the inner light-shielding layer as illustrated in FIG. 6.

As illustrated in FIG. 6, the portion of the first flattening layer 4 in the outer section A2*b* is the same layer member as the portions of the first flattening layer 4 in the light-receiving effective region A1 and the inner section A2*a* and is contiguous to the portion of the first flattening layer 4 in the inner section A2*a*.

The outer light-shielding layer 25 is a layer member adjacent to and surrounding the peripheral surface 15*a* of the inner light-shielding layer 15. As illustrated in FIG. 1, the peripheral surface 25*a* of the outer light-shielding layer 25 constitutes the outer edge of the surrounding light-shielding region A2. The outer light-shielding layer 25 is preferably formed between the outer projections 37 and the semiconductor substrate 2 in the thickness direction of the solid-state image sensor 1.

As with the inner light-shielding layer 15, the outer light-shielding layer 25 is provided to reduce external incident light and internally incident light. As illustrated in FIG. 1, the peripheral surface 25*a* in plan view has a substantially rectangular shape with the four rounded corners.

The outer light-shielding layer 25 is disposed on the outside of the inner light-shielding layer 15 in plan view, further apart from the light-receiving effective region A1, and thus may have lower light-shielding performance than the inner light-shielding layer 15, which is closer to the surrounding the light-receiving effective region A1.

The outer light-shielding layer 25 is not particularly limited as long as it is structured to absorb at least part of the external incident light and the internally reflected light. The outer light-shielding layer 25 may have a single-layer or multilayer structure. For example, a colored layer colored with a colorant of appropriate color may be used for the outer light-shielding layer 25.

For example, an outer light-shielding layer 25 having a single-layer structure may be formed of the same material as one of the red colored layer 5*r*, green colored layer 5*g*, and blue colored layer 5*b*.

The blue colored layer 5*b* or the red colored layer 5*r* is particularly preferable.

In the present embodiment, a blue colored layer 5*b* used in the filter module 5 is laminated on the first flattening layer 4 at the same thickness as the inner light-shielding layer 15. In this case, the outer light-shielding layer 25 can be formed during production of the blue colored layers 5*b* in the filter module 5, which simplifies the production process.

The portion of the second flattening layer 6 in the outer section A2*b* is the same layer member as the portions of the second flattening layer 6 in the light-receiving effective region A1 and the inner section A2*a* and is contiguous to the portion of the second flattening layer 6 in the inner section A2*a*.

The portion of the second flattening layer 6 in the outer section A2*b* is formed in the same process as that for the portion of the second flattening layer 6 in the light-receiving effective region A1 after formation of the inner light-shielding layer 15 and the outer light-shielding layer 25.

As illustrated in FIG. 5, the outer projections 37 are provided in the outer section A2*b*. As illustrated in FIG. 6, the outer projections 37 constitute a layer member that provides the portion of the anti-reflection film 8 in the outer section A2*b* with an uneven shape that has unevenness in the thickness direction of the outer light-shielding layer 25. The surface shape of the outer projections 37 is not particularly limited as long as it can provide the anti-reflection film 8 with an uneven shape that improves its flexural strength. A particularly preferable uneven shape of the anti-reflection film 8 is a wave shape with concavities and convexities alternately appearing in the thickness direction of the outer light-shielding layer 25 when viewed in an inward direction from the outer edge of the anti-reflection film 8. The wave shape of the anti-reflection film 8 may be a sinusoidal wave shape or a wave shape other than a sinusoidal wave shape, for example, a wave shape with contiguous circular arcs convex upward. A larger wave amplitude is more preferable for the wave shape of the anti-reflection film 8 because a larger wave amplitude provides a larger second moment of area.

In the present embodiment, the outer projections 37, which are provided in the outer section A2*b*, have the same shape as the lenses 7.

The outer projections 37 are formed in the same rectangular grid pattern as the lenses 7 at the same pitch P as the lenses 7. Thus, in the present embodiment, with the light-receiving effective region A1 located in the extension of rows of the outer projections 37 that extend in the longitudinal or lateral direction, these rows of outer projections 37 are each aligned with a corresponding row of lenses 7 in the light-receiving effective region A1.

The outer projections 37 are formed in the same manner as the lenses 7 using the same material as the lenses 7. In this case, the outer projections 37 can be produced during formation of the lenses 7, which simplifies the production process.

As illustrated in FIG. 5, outer projections 37 are formed from inside or outside the peripheral surface 15*a* toward the peripheral surface 25*a*.

As illustrated in FIG. 6, the peripheral portions of the second flattening layer 6 and the outer projections 37 have been broken in the thickness direction to form, as a broken surface, a peripheral surface E intersecting the surface of the semiconductor substrate 2.

Although FIG. 6, as a schematic diagram, illustrates the peripheral surface E perpendicular to the surface of the semiconductor substrate 2, the peripheral surface E is formed by etching as will be described later and thus may be inclined relative to a normal to the surface of the semiconductor substrate 2 or curved relative to a plane normal to the surface of the semiconductor substrate 2.

As illustrated in FIG. 1, the peripheral surface E in plan view is located within the peripheral surface 25*a* and extends along the entire peripheral surface 25*a*.

Three or more outer projections 37 are aligned in respective rows except for those broken by formation of the peripheral surface E. Although three or more outer projections 37 are aligned in respective rows in the present embodiment, at least two outer projections 37 only need to be aligned in respective rows from the viewpoint of peel prevention.

As illustrated in FIG. 5, those of the outer projections 37 particularly at the curved portions of the peripheral surface E are disposed outside the peripheral surface 15*a* and inside the peripheral surface 25*a*. Thus, the outer projections 37 are formed in a strip shape along the peripheral surface E.

The surfaces of such a group of outer projections 37 form an uneven shape constituted by upwardly convex lens shapes formed two-dimensionally.

As illustrated in FIG. 6, the anti-reflection film 8 in the outer section A2*b* is the same as the anti-reflection film 8 over the lenses 7 except that the former anti-reflection film 8 is formed on the surface of the outer projections 37, which intersect the peripheral surface E, and has at least part protruding outside the peripheral surface E.

Thus, the anti-reflection film 8 of the present embodiment includes a first anti-reflection film portion 8*a* (see FIGS. 3 and 4) formed on the lenses 7, a second anti-reflection film portion 8*b* (see FIGS. 3 and 4) formed on the inner projections 17, a third anti-reflection film portion 8*c* (see FIGS. 3 and 4) formed on the flat resin layer 27, and a fourth anti-reflection film portion 8*d* (see FIG. 6) formed on the outer projections 37.

These anti-reflection film portions 8 have the same thickness as each other because they are formed in the same process described later, and these anti-reflection film portions 8 also have the same anti-reflection function since the inner projections 17, flat resin layer 27, and outer projections 37 are composed of the same material as the lenses 7.

The first anti-reflection film portion 8*a* is an inner film portion formed over the respective lenses 7 in the light-receiving effective region A1. The first anti-reflection film portion 8*a* is formed in a central rectangular region of the anti-reflection film 8 in plan view.

The fourth anti-reflection film portion 8*d* is a peripheral film portion formed as a peripheral portion of the anti-reflection film 8 in plan view, and covering part of a region that has formed therein the outer light-shielding layer 25 or the inner light-shielding layer 15, or more specifically, the part of this region where the outer light-shielding layer 25 is disposed.

The third anti-reflection film portion 8*c* is a flat intermediate film portion disposed between the first anti-reflection film portion 8*a* as an inner film portion and the fourth anti-reflection film portion 8*d* as a peripheral film portion and covering part of a region where the inner light-shielding layer 15 is disposed or part of the region where the outer light-shielding layer 25 is disposed.

At least part of the outer edge of the fourth anti-reflection film portion 8*d* has a protruding part 8*e* protruding outside the peripheral surface E.

As will be described later, the protruding part 8*e* of the fourth anti-reflection film portion 8*d* is formed due to an etching gas eroding the side surfaces of outer projections 37 when portions of outer projections 37 located outside the outer edge of the fourth anti-reflection film portion 8*d* are etched away after the fourth anti-reflection film portion 8*d* is formed on the outer projections 37.

Here, in the case where the peripheral surface E is inclined or curved in a height direction, the amount of protrusion d is a value measured from a point e at which the peripheral surface E of the outer projections 37 is in contact with the fourth anti-reflection film portion 8*d* in plan view.

In the present embodiment, in cross section taken in the direction of protrusion as illustrated in FIG. 6, and when viewed in the direction of protrusion as illustrated in FIG. 7, the fourth anti-reflection film portion 8*d* has an uneven shape in the thickness direction of the outer light-shielding layer 25. This improves the flexural strength and the flexural rigidity of the fourth anti-reflection film portion 8*d*. Thus, a maximum amount of protrusion d is 40% or more and 200% or less of the pitch P of the outer projections 37. This configuration can prevent the fourth anti-reflection film portion 8*d* from peeling off due to an external force such as water pressure in a cleaning process or the like. If the maximum amount of protrusion d is greater than 100% of the pitch P of the outer projections 37, the amount of chipping of the protruding part 8*e* increases.

Accordingly, from the viewpoint of chip prevention, the maximum amount of protrusion d is preferably 40% or more and 100% or less of the pitch P of the outer projections 37, and more preferably 40% or more and 70% or less thereof.

Evaluations of the solid-state image sensor in the present embodiment are shown in Table 1.

The solid-stage image sensors of Examples 1 to 6 were produced with variations in pixel size and maximum amount of protrusion. The pixel size (pitch P) was 1.1 μm for Examples 1 and 2 and 1.0 μm for Examples 3 to 6. Note that the pixel sizes in the present examples are merely examples.

The maximum amount of protrusion d was set to 0.46 μm for Example 1, 0.51 μm for Example 2, 0.63 μm for Example 3, 0.80 μm for Example 4, 0.92 μm for Example 5, and 1.04 μm for Example 6. This resulted in the ratio of the maximum amount of protrusion d to the pitch P of the outer projections 37 being 42% in Example 1, 46% in Example 2, 63% in Example 3, 80% in Example 4, 92% in Example 5, and 104% in Example 6.

TABLE 1

Unit: μm

| | Pixel size | Maximum amount of protrusion | Ratio | Evaluation |
|---|---|---|---|---|
| Example 1 | 1.1 | 0.46 | 42% | A |
| Example 2 | 1.1 | 0.51 | 46% | A |
| Example 3 | 1.0 | 0.63 | 63% | A |
| Example 4 | 1.0 | 0.80 | 80% | B |
| Example 5 | 1.0 | 0.92 | 92% | B |
| Example 6 | 1.0 | 1.04 | 104% | B |

In Examples 1 to 3, almost no chipping and peeling occurred at the outer edge of the fourth anti-reflection film portion 8*d*, and thus the evaluation was A (excellent). In Examples 4 and 5, a little chipping and peeling were found to occur at the outer edge of the fourth anti-reflection film portion 8*d* within such an allowable range that there would be no practical problem, and thus the evaluation was B (good). Chipping and peeling occurred at a lower ratio in Examples 1 to 3 than in Examples 4 and 5.

In Example 6, chipping occurred at the outer edge of the fourth anti-reflection film portion 8*d*, but no peeling occurred thereat, and thus the evaluation was B (good).

From the above, it was found that the maximum amount of protrusion d is preferably 40% or more and 100% or less of the pixel size determined by the pitch P of photoelectric conversion elements 3, and most preferably 40% or more and 70% or less thereof.

Although the pitch of the convex portions of the lenses 7 is formed to match the pitch of the photoelectric conversion elements 3 in the present embodiment, some or all of the lenses 7 and the photoelectric conversion elements 3 may be different in pitch therebetween. In the case of the convex portions of the lenses 7 being different in pitch from the photoelectric conversion elements 3, the maximum amount of protrusion d by which the fourth anti-reflection film portion 8*d* protrudes outside the outer projections 37 is 40% or more and 200% or less of at least one of the pitch of the convex portions of lenses 7 and the pixel size determined by photoelectric conversion elements 3.

A description will be provided of an example of a method according to the present embodiment for producing a solid-state image sensor, used in producing the solid-state image sensor 1. This description focuses on a method of forming the outer section A2*b* of the surrounding light-shielding region A2.

FIGS. 8 to 14 are schematic diagrams illustrating an example of a method according to the present embodiment for producing a solid-state image sensor.

For production of the solid-state image sensor 1, a semiconductor substrate 2 is prepared that has formed thereon photoelectric conversion elements 3. The photoelectric conversion elements 3, a peripheral circuit and wiring for obtaining an output from the photoelectric conversion elements 3, and electrode pads, which are all formed on the semiconductor substrate 2, may be produced by a known semiconductor manufacturing process based on the type of the solid-state image sensor 1.

Figure 8:
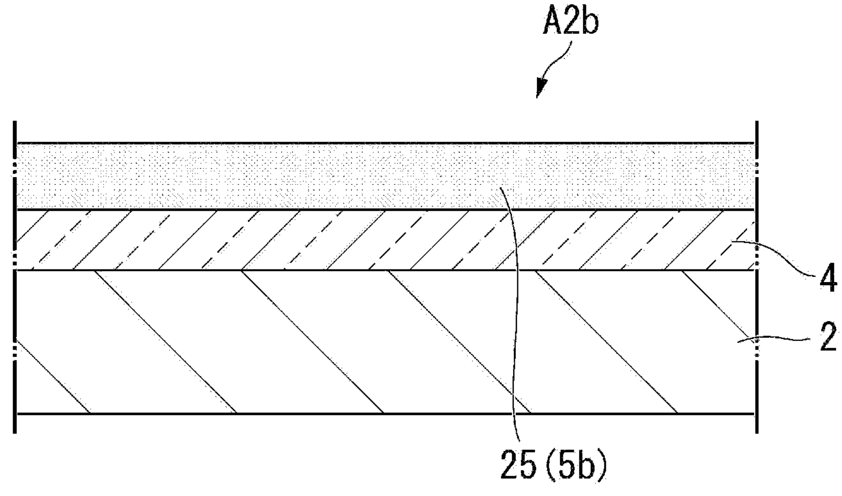
FIG. 8 is a schematic diagram illustrating an example method for producing a solid-state image sensor according to an embodiment of the present invention.

As illustrated in FIG. 8, a first flattening layer 4 is subsequently formed on the semiconductor substrate 2. The first flattening layer 4 may be formed, for example, by using spin coating to apply, to a surface of the semiconductor substrate 2, a colorless, transparent acrylic resin solution at a thickness of about 0.1 μm, and heat-curing the applied solution.

The first flattening layer 4 is formed on the entire surface of the semiconductor substrate 2.

Subsequently, resin layers including a filter module 5, an inner light-shielding layer 15, and an outer light-shielding layer 25 are formed on the first flattening layer 4.

In the present embodiment, the filter module 5, inner light-shielding layer 15, and outer light-shielding layer 25 are each composed of one of a red colored layer 5*r*, a green colored layer 5*g*, and a blue colored layer 5*b*, or a combination thereof.

Accordingly, each of the resin layers can be formed of one or more colored layers necessary for the respective resin layers by patterning such that the position, shape, and thickness of the colored layers correspond to those of the respective resin layers.

Each colored layer can be formed by using spin coating to apply, to a surface of the first flattening layer 4, a colorant such as a pigment having spectral transmittance characteristics of the corresponding colored layer and a photosensitive material containing an alkali-soluble resin, patterning the photosensitive material by photolithography involving exposure and development, and curing the resulting material. The red colored layers 5*r*, green colored layers 5*g*, and blue colored layers 5*b* may be formed in any order.

In the present embodiment, however, it is more preferable to at least form the red colored layer 5*r* before formation of the blue colored layer 5*b* because the red colored layer 5*r* and the blue colored layer 5*b* are laminated in this order in the inner light-shielding layer 15.

When the filter module 5, inner light-shielding layer 15, and outer light-shielding layer have been thus formed, a portion of the first flattening layer 4 in the outer section A2*b* has formed thereon the outer light-shielding layer 25 as illustrated in FIG. 8. For example, the outer light-shielding layer 25 may be formed of the blue colored layer 5*b*. In this case, the outer light-shielding layer 25 is formed together with the blue colored layers 5*b* of the filter module 5 during formation of the blue colored layers 5*b* of the filter module 5.

The peripheral surface 25*a* of the outer light-shielding layer 25 in plan view has a substantially rectangular shape, surrounding the outer edge of the filter module 5.

Subsequently, on the resin layers including the filter module 5, inner light-shielding layer 15, and outer light-shielding layer 25, a transparent resin layer 6A is formed in which the second flattening layer 6, lenses 7, inner projections 17, flat resin layer 27, and outer projections 37 are to be formed. In the present embodiment, the lenses 7, inner projections 17, flat resin layer 27, and outer projections 37 are formed of the same material, the lenses 7, inner projections 17, flat resin layer 27, and outer projections 37 may be hereinafter referred to as "lenses 7 and the like".

In the case of the second flattening layer 6 being different in material from the lenses 7 and the like, the transparent resin layer 6A is composed of a first layer and a second layer. In this case, first, the first layer is formed by applying the material for forming the second flattening layer 6 to the respective resin layers and curing the applied material such that this material will have a thickness of the second flattening layer 6 when cured. The second layer is then formed by applying the material for forming the lenses 7 and the like to the first layer and curing the applied material such that this material when cured will have a thickness that allows formation of the lenses 7 and the like.

In the case of the second flattening layer 6 and the lenses 7 and the like being composed of the same material, the transparent resin layer 6A is formed such that the thickness thereof after curing allows formation of the second flattening layer 6 and the lenses 7 and the like.

The transparent resin layer 6A may be formed using spin coating to apply a transparent resin for forming the transparent resin layer 6A. With such a method, the transparent resin layer 6A is formed on the surfaces of the filter module 5, inner light-shielding layer 15, and outer light-shielding layer 25, and the portion of the first flattening layer 4 outside these surfaces.

Subsequently, the lenses 7, inner projections 17, flat resin layer 27, and outer projections 37 are formed on the surface of the transparent resin layer 6A. In the present embodiment, the lenses 7 are formed simultaneously with the inner projections 17, flat resin layer 27, and outer projections 37 using the same production method as for these components. The following description is provided taking an example in which the lenses 7 are formed using the transfer-type method.

Figure 9:
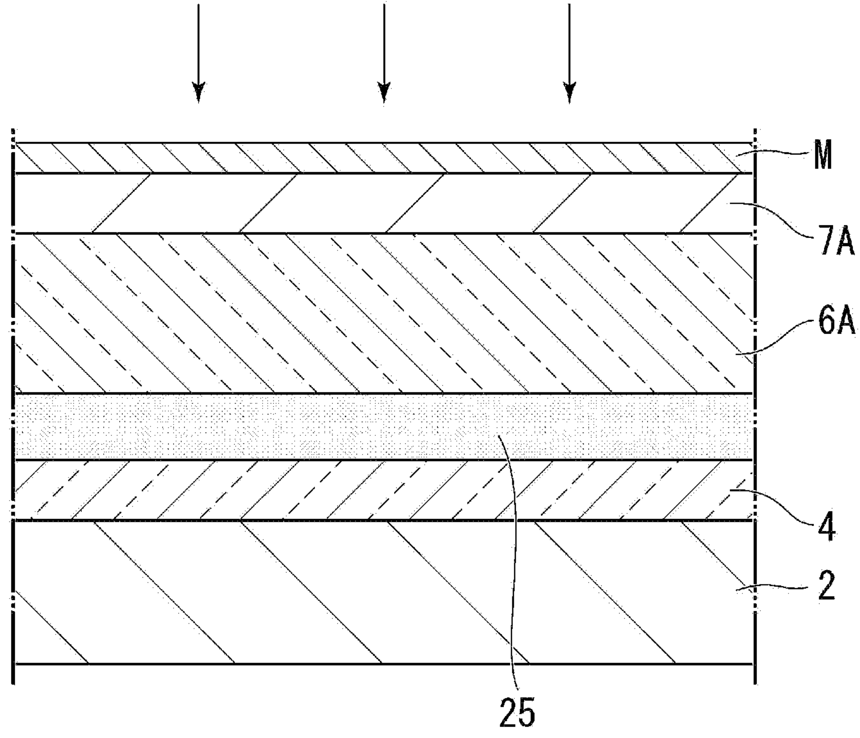
FIG. 9 is a schematic diagram illustrating an example method for producing a solid-state image sensor according to an embodiment of the present invention.

As illustrated in FIG. 9, a resist material 7A composed of an alkali-soluble, photosensitive, and thermally reflowable resin material is laminated on the transparent resin layer 6A to form a lens-forming layer. A photomask M is then placed on the resist material 7A, and the resist material 7A is exposed to light.

Here, the photomask M has formed therein an exposure pattern for dividing the lens-forming layer and forming, in the lens-forming layer, shapes corresponding to the lenses 7, inner projections 17, flat resin layer 27, and outer projections 37. The photomask M is positioned relative to the semiconductor substrate 2 so that the lenses 7 face the respective photoelectric conversion elements 3.

Figure 10:
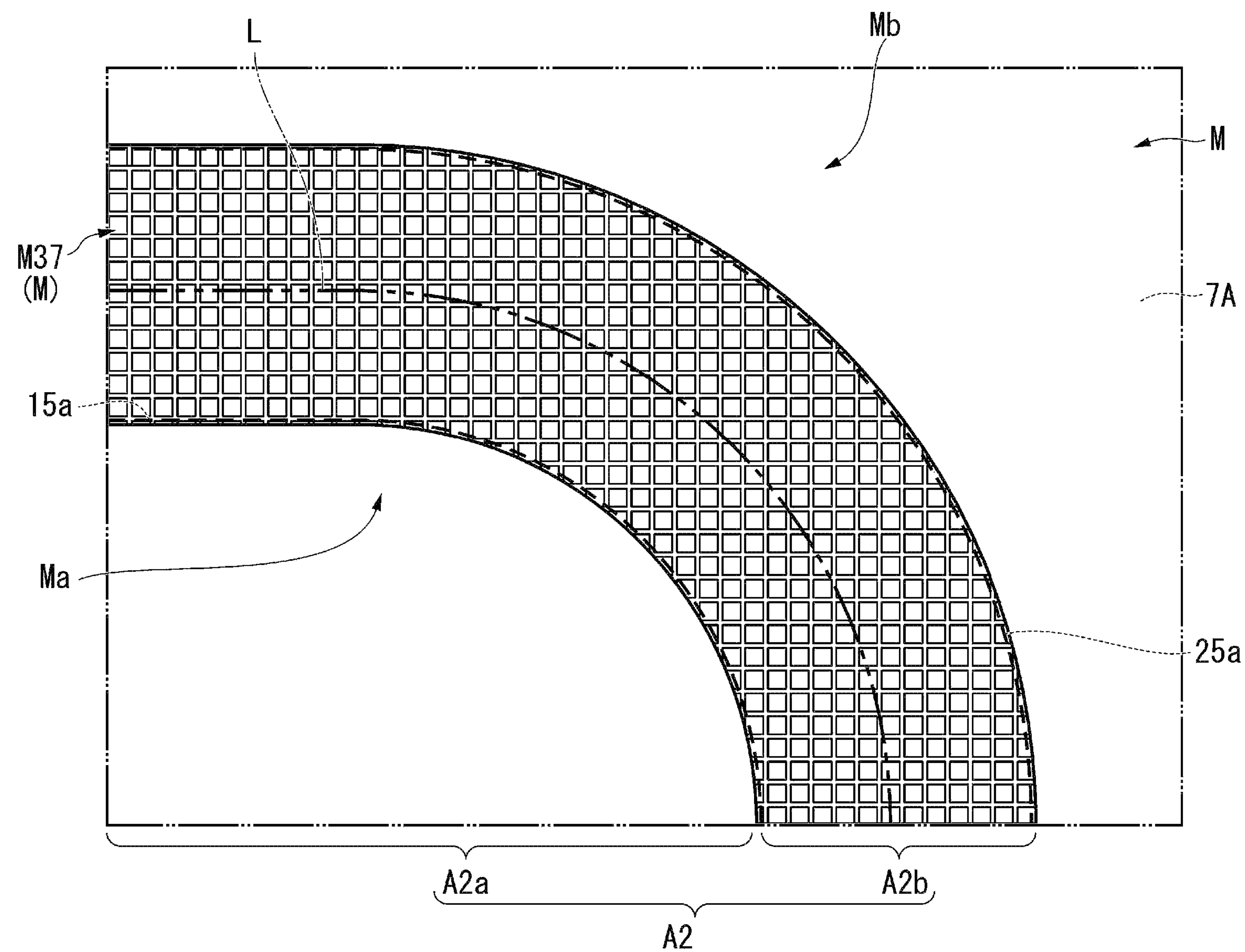
FIG. 10 is a schematic diagram illustrating an example method for producing a solid-state image sensor according to an embodiment of the present invention.

FIG. 10 shows an example of a photomask M for forming the flat resin layer 27 and the outer projections 37 in the outer section A2*b*. FIG. 10 illustrates a region corresponding to the part F5 shown in FIG. 1.

The photomask M has formed therein a mask pattern M37 for removing unnecessary portions of the resist material 7A to form the outer projections 37. In the light-receiving effective region A1, the photomask M has formed therein a mask pattern (not illustrated) for removing unnecessary portions of the resist material 7A to form the lenses 7. In the present embodiment, the mask pattern for forming the lenses 7 and the mask pattern M37 are identical except for the locations in which these patterns are formed.

The mask pattern M37 is formed so as to cover a region extending from near the peripheral surface 15*a* to near the peripheral surface 25*a*.

The mask pattern M37 has an inner section Ma that forms an inner section of the outer projections 37. The inner section Ma is formed within a removal line L that defines the outer edge of the fourth anti-reflection film portion 8*d*, in a location where three or more outer projections 37 are to be formed in respective rows. Although three or more outer projections 37 are aligned in respective rows in the present embodiment, at least two outer projections 37 only need to be aligned in respective rows from the viewpoint of peel prevention.

The mask pattern M37 has an outer section Mb that covers a region outside the removal line L.

The resist material 7A having the photomask M thereon is then exposed to light.

At this time, the mask pattern M37 formed is located in an area covering the inner light-shielding layer 15 and the outer light-shielding layer 25. Thus, the inner light-shielding layer 15 and the outer light-shielding layer 25 are disposed beneath the transparent resin layer 6A. The outer light-shielding layer 25 has a level difference-adjusting function of allowing the surface of a portion of the transparent resin layer 6A in the surrounding light-shielding region A2 to be flush with the portion of the transparent resin layer 6A in the light-receiving effective resin A1 when the resist material 7A is exposed to light. This makes it possible to subject the resist material 7A to exposure to a pattern of light for the outer projections 37 as with the lenses 7 at the same focus setting as for the light-receiving effective region A1, thus allowing this exposure to a pattern of light for the outer projections 37 to be performed successfully. For example, if the outer light-shielding layer 25 is not provided, the exposure light becomes out of focus in the surrounding light-shielding region A2, which may result in the outer projections 37 having shapes that cannot be resolved.

The outer light-shielding layer 25 also has a function of attenuating exposure light which has been reflected off the semiconductor substrate 2 and travelling to be incident on the transparent resin layer 6A again. Thus, the shapes of the outer projections 37 can also be formed well in that excessive exposure due to reflected light from the semiconductor substrate 2 is prevented.

Subsequently, the exposed resist material 7A is developed to remove unnecessary portions thereof. Thus, the resist material 7A is patterned such that the surface thereof has shapes generally corresponding to the lenses 7, inner projections 17, flat resin layer 27, and outer projections 37.

The resist material 7A is then heated by thermal reflow to form, in the surface of the resist material 7A, a mold shape corresponding to the lenses 7, inner projections 17, flat resin layer 27, and outer projections 37.

The mold shape formed in the resist material 7A is then transferred by dry etching to the transparent resin layer 6A, which thus has formed therein asperities including the lenses 7, inner projections 17, flat resin layer 27, and outer projections 37.

Figure 11:
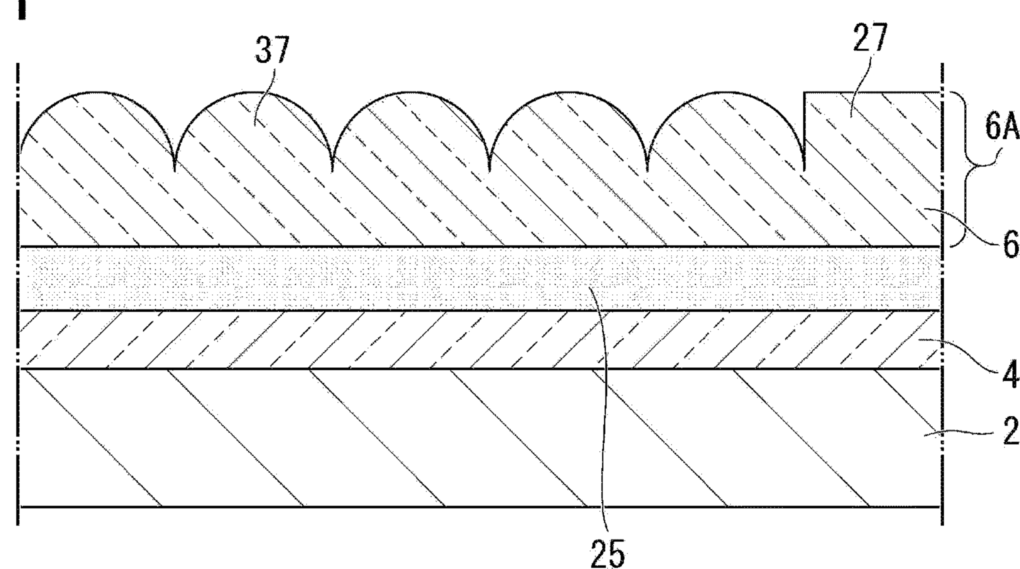
FIG. 11 is a schematic diagram illustrating an example method for producing a solid-state image sensor according to an embodiment of the present invention.

Thus, in the outer section A2*b*, for example, the second flattening layer 6 and asperities formed on the second flattening layer 6 and including the outer projections 37 and flat resin layer 27 are formed as illustrated in FIG. 11. In the light-receiving effective region A1 and the inner section A2*a* adjacent to this region, asperities including the lenses 7 and inner projections 17 are formed.

Figure 12:
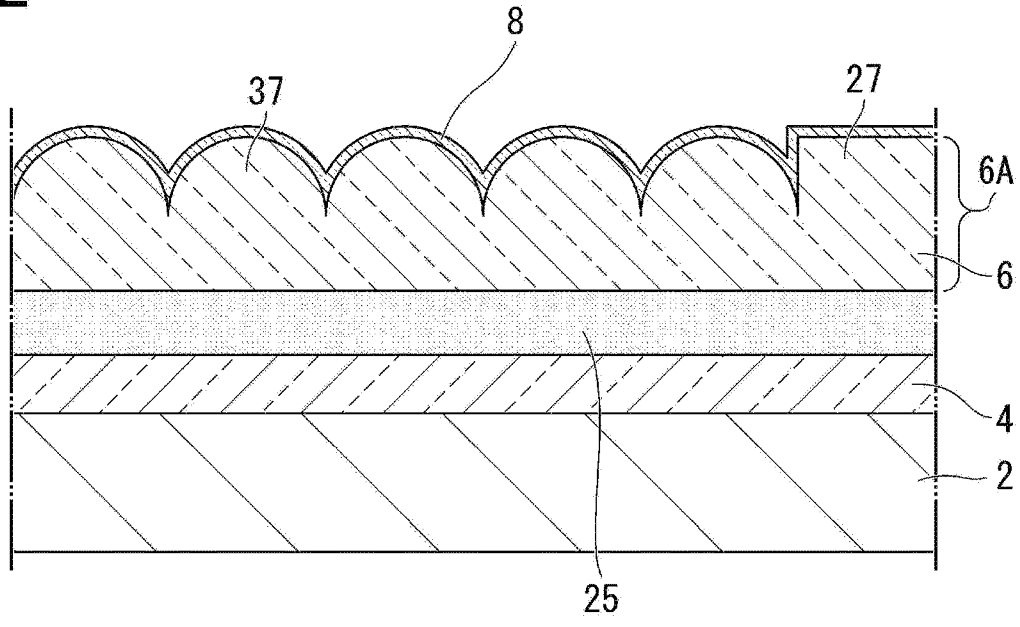
FIG. 12 is a schematic diagram illustrating an example method for producing a solid-state image sensor according to an embodiment of the present invention.

Subsequently, as illustrated in FIG. 12, the anti-reflection film 8 is formed on the surface of the transparent resin layer 6A that has formed therein an uneven shape formed by the lenses 7 and the like. For example, as the anti-reflection film 8, a thin film of silicon dioxide is formed by chemical vapor deposition (CVD). The anti-reflection film 8 conforms to the uneven shape of the surface of the transparent resin layer 6A. Thus, the surface of the anti-reflection film 8 includes uneven surface portions and a flat surface portion that conform to the uneven shape of the transparent resin layer 6A.

The anti-reflection film 8 is formed over the entire surface of the transparent resin layer 6A.

In the above production process, the first flattening layer 4, transparent resin layer 6A, and anti-reflection film 8 are laminated in this order in the substrate peripheral region A3. Thus, the scribe lines S and electrode pads 9 in the substrate peripheral region A3 are also covered by the first flattening layer 4, transparent resin layer 6A, and anti-reflection film 8.

Accordingly, portions of the first flattening layer 4, transparent resin layer 6A, and anti-reflection film 8 on the scribe lines S and electrode pads 9 are removed.

Figure 13:
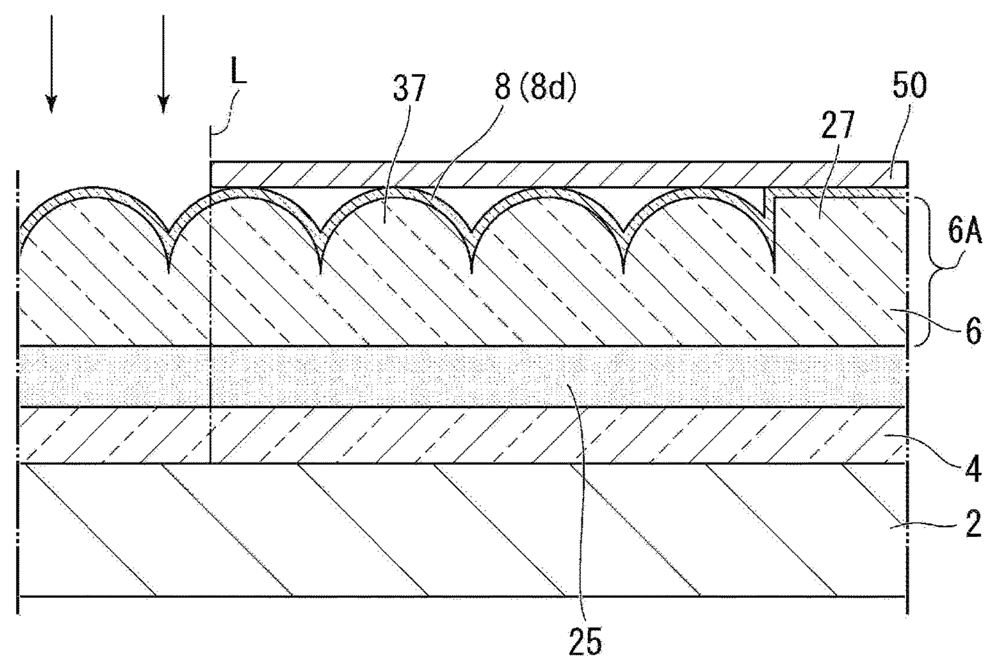
FIG. 13 is a schematic diagram illustrating an example method for producing a solid-state image sensor according to an embodiment of the present invention.

First, as illustrated in FIG. 13, a mask 50 is placed on the portion of the anti-reflection film 8 within the removal line L, and the portion of the anti-reflection film 8 outside the mask 50 is removed by dry etching. The type of dry etching is appropriately selected that can be used to etch the material of the anti-reflection film 8. For example, in the case of the anti-reflection film 8 being composed of silicon dioxide, reactive ion etching using fluorine gas as an etching gas, for example, may be used.

Consequently, the portion of the anti-reflection film 8 outside the mask 50 is removed, and thus the outer edge of the fourth anti-reflection film portion 8*d* is formed. On the portion of the transparent resin layer 6A which has been covered by the removed portion of the anti-reflection film 8, the surface of the outer projections 37 is exposed.

Figure 14:
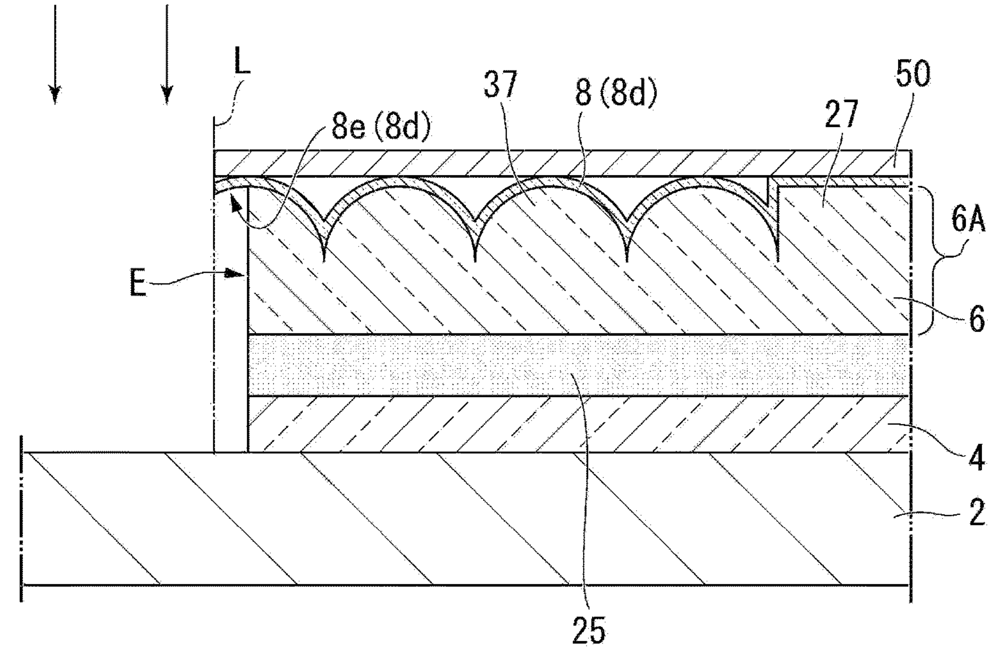
FIG. 14 is a schematic diagram illustrating an example method for producing a solid-state image sensor according to an embodiment of the present invention.

Subsequently, as illustrated in FIG. 14, the portion of the transparent resin layer 6A outside the mask 50 is removed by dry etching. The type of dry etching is appropriately selected that can be used to etch the material of the transparent resin layer 6A. For example, in the case of the transparent resin layer 6A being composed of organic resin, reactive ion etching using oxygen gas as an etching gas, for example, may be used.

In reactive ion etching, as the etching proceeds, the etching gas also flows to the portion of the transparent resin layer 6A under the fourth anti-reflection film portion 8*d*, thereby gradually etching the side surface of the transparent resin layer 6A on the outer light-shielding layer 25.

Thus, during removal of the portion of the transparent resin layer 6A on the outer light-shielding layer 25, part of the transparent resin layer 6A under the outer edge of the fourth anti-reflection film portion 8*d* is removed. Consequently, a protruding part 8*e* is formed that protrudes outside the peripheral surface E.

As the transparent resin layer 6A is etched, the outer light-shielding layer 25 and first flattening layer 4 are also etched. When the portions of the anti-reflection film 8, transparent resin layer 6A, and first flattening layer 4 have been removed, the scribe lines S and the surface of the semiconductor substrate 2 are exposed, and the electrode pads 9 are also exposed. Accordingly, energization testing and the like using the electrode pads 9 are possible.

Thus, solid-state image sensors 1 are formed in different regions each bounded by their respective scribe lines S on the silicon wafer W.

Subsequently, for example, a cleaning process and the like are performed, and the silicon wafer W is cut along the scribe lines S, to thereby produce the separate solid-state image sensors 1.

According to the solid-state image sensor 1 of the present embodiment, the peripheral portion of the anti-reflection film 8 is constituted by the fourth anti-reflection film portion 8*d* having unevenness in the thickness direction. The outer edge of the fourth anti-reflection film portion 8*d* has the protruding part 8*e*, which has been formed in the etching process for the transparent resin layer 6A and protrudes outside the peripheral surface E of the outer projections 37 and second flattening layer 6. However, the protruding part 8*e* has a larger second moment of area than a flat plate because it is part of the fourth anti-reflection film portion 8*d* having an uneven shape. Thus, the fourth anti-reflection film portion 8*d* is less likely to peel off when the protruding part 8*e* is subjected to an external force during a cleaning process or the like, for example.

Setting a maximum amount of protrusion of the protruding part 8*e* to 40% or more and 200% or less of the pitch of the outer projections 37 further reduces the tendency of the fourth anti-reflection film portion 8*d* to peel off.

Such an effect of the present embodiment will be described in comparison with a comparative example.

Figure 15:
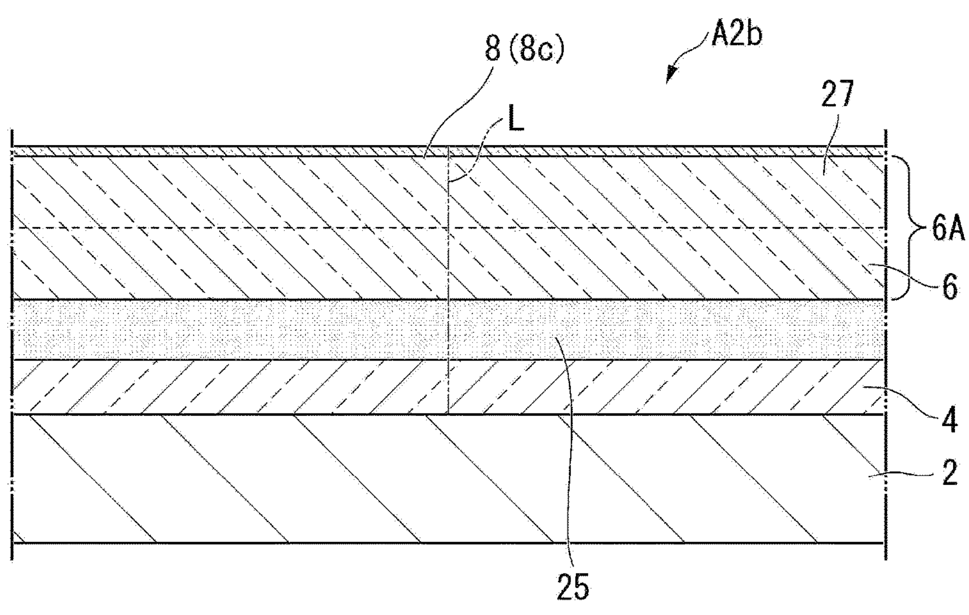
FIG. 15 is a schematic diagram illustrating a method for producing a solid-state image sensor of a comparative example.
Figure 16:
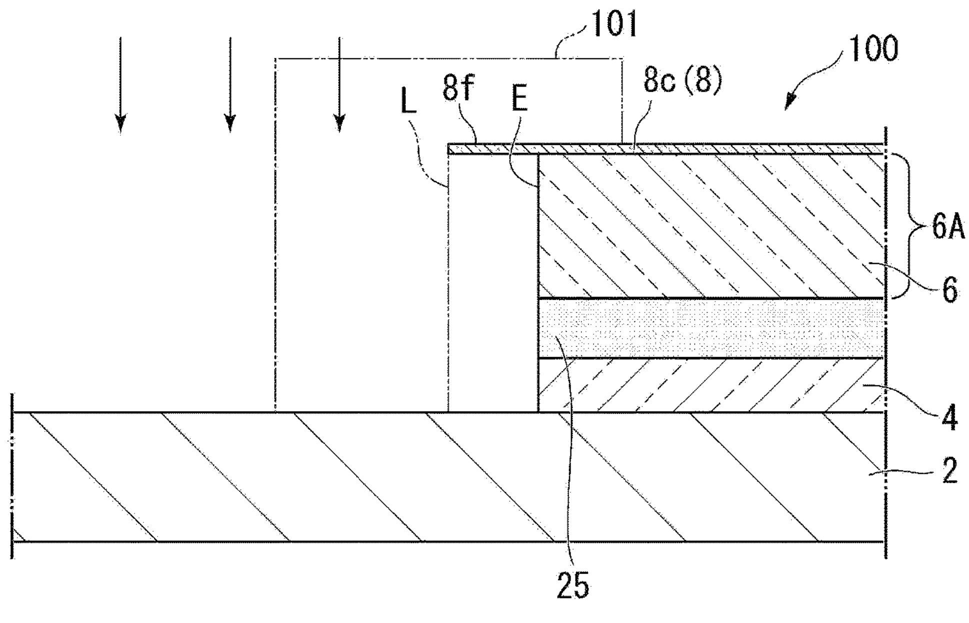
FIG. 16 is a schematic diagram illustrating a method for producing a solid-state image sensor of a comparative example.
Figure 17:
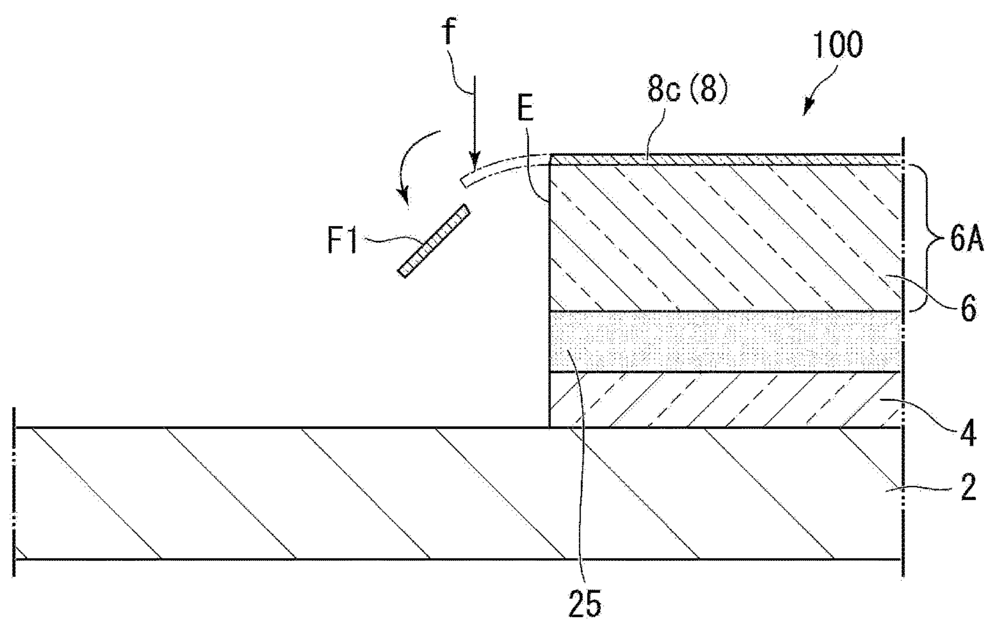
FIG. 17 is a cross-sectional view illustrating an example of damage to the solid-state image sensor of the comparative example.
Figure 18:
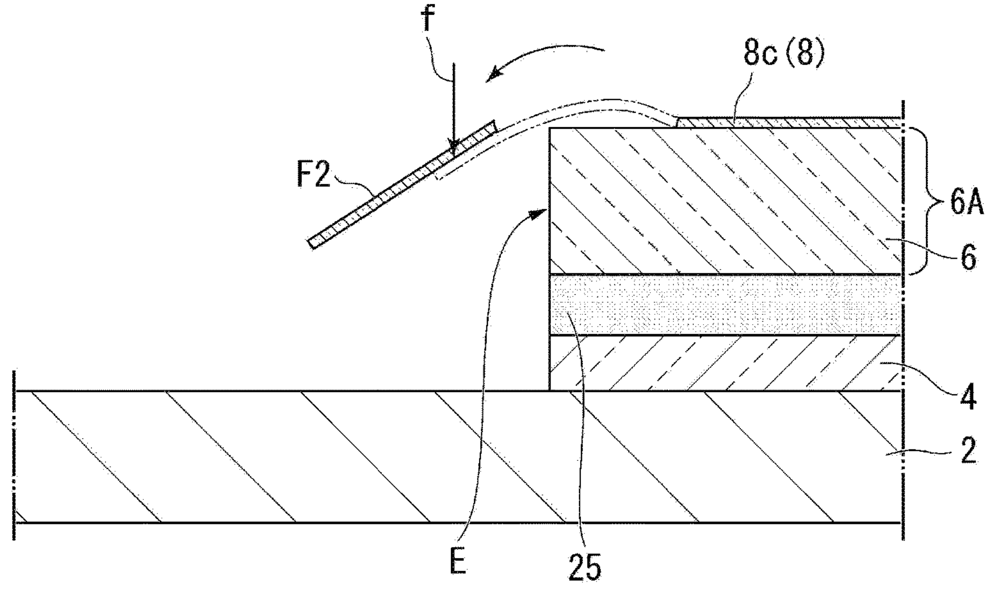
FIG. 18 is a cross-sectional view illustrating an example of damage to the solid-state image sensor of the comparative example.

FIGS. 15 and 16 are schematic diagrams illustrating a method for producing a solid-state image sensor of the comparative example. FIGS. 17 and 18 are cross-sectional views each illustrating an example of damage to the solid-state image sensor of the comparative example.

The solid-state image sensor of the comparative example is produced in the same manner as the present embodiment except that the flat resin layer 27 is formed in the outer section A2*b* instead of the outer projections 37.

Thus, as illustrated in FIG. 15, the portion of the transparent resin layer 6A in the outer section A2*b* includes, as its upper layer portion, the flat resin layer 27 when the anti-reflection film 8 has been formed. The anti-reflection film 8 is formed on the surface of the flat resin layer 27, and thus the anti-reflection film 8 in the outer section A2*b* is constituted by the flat third anti-reflection film portion 8*c*.

Subsequently, the anti-reflection film 8 and the transparent resin layer 6A are etched in this order as with the present embodiment, resulting in the solid-state image sensor 100 of the comparative example as illustrated in FIG. 16.

In the solid-state image sensor 100, the outer edge of the third anti-reflection film portion 8*c* is formed along the removal line L, and the protruding part 8*f* protruding outside the peripheral surface E of the transparent resin layer 6A is formed.

Since the protruding part 8*f* is a flat thin film, its second moment of area is much lower than the protruding part 8*e*, and thus the protruding part 8*f* is significantly more likely to break than the protruding part 8*e*.

For example, as illustrated in FIG. 17, the protruding part 8*f* breaks at its proximal end when an external force f is exerted on its distal end in a direction toward the semiconductor substrate 2. A piece of the broken protruding part 8*f* becomes scattered as fragments F1 on the surface of the solid-state image sensor 100. The fragment F1 may rub against and damage the surface of the solid-state image sensor 100. If the surface of the solid-state image sensor 100 is damaged, the solid-state image sensor 100 may become defective.

For example, as illustrated in FIG. 18, if the adhesion between the third anti-reflection film portion 8*c* and the transparent resin layer 6A is excessively low near the peripheral surface E, an external force f exerted on the protruding part 8*f* may cause a portion of the third anti-reflection film portion 8*c* near the peripheral surface E to peel off from the surface of the transparent resin layer 6A, possibly resulting in the third anti-reflection film portion 8*c* breaking at a portion within the peripheral surface E. In this case, a piece of the broken third anti-reflection film portion 8*c* becomes scattered as fragments F2 on the surface of the solid-state image sensor 100. The fragment F2 may rub against and damage the surface of the solid-state image sensor 100.

In the present embodiment, since the part of the fourth anti-reflection film portion 8*d* within the protruding part 8*e* is in close contact with outer projections 37 formed in rows each including three or more thereof, the adhesion area between that part of the fourth anti-reflection film portion 8*d* and the outer projections 37 is large, which allows the fourth anti-reflection film portion 8*d* to not easily shear off along the surface of the outer projections 37. Thus, the fourth anti-reflection film portion 8*d* does not easily peel off at a portion near the peripheral surface E.

In the comparative example, to prevent damage to the third anti-reflection film portion 8*c*, one may consider measures for avoiding formation of the protruding part 8*f* For example, after etching of the third anti-reflection film portion 8*c* is completed, a protective resin layer 101 (refer to the chain double-dashed line in FIG. 16) for protecting the third anti-reflection film portion 8*c* and the peripheral surface E formed under the third anti-reflection film portion 8*c* is formed on the peripheral portion of the third anti-reflection film portion 8*c* and a portion of the semiconductor substrate 2 outside this peripheral portion. For example, the protective resin layer 101 may be formed by photolithography using, for example, the same transparent resin as the transparent resin layer 6A.

However, this production method of the comparative example requires production steps of forming and removing the protective resin layer. Thus, the number of production steps is increased, resulting in an increase in production time and production cost compared to the present embodiment.

As described above, according to the solid-state image sensor 1 of the present embodiment, damage (including peeling or chipping) to the outer edge of the anti-reflection film 8 can be prevented since the fourth anti-reflection film portion 8*d* has an uneven shape that conforms to the surface of the outer projections 37.

The production method of the present embodiment allows the outer projections 37 to be formed in the same production process as the lenses 7 and in the same manner as the lenses 7, thus enabling efficient production of the solid-state image sensor 1 including the anti-reflection film 8 with its outer edge prevented from peeling off. In the above embodiment, a description is provided taking an example in which the outer projections 37 have the same shape as the lenses 7. However, the shape of the outer projections 37 is not limited to the shape of the lenses 7 as long as an uneven shape can be formed in the fourth anti-reflection film portion 8*d*. That is, because the outer projections 37 do not require a light-collecting action, they may not have a shape that is the same as or similar to the convex lens surface shape of the lenses 7. An uneven shape formed by the outer projections 37 may be a shape that does not function as a lens.

For example, the outer projections 37 may be formed at a pitch different from that of the lenses 7. For example, in the case of the lenses 7 being formed at a pitch of 0.8 μm, the outer projections 37 may be formed at a greater pitch, such as 1.0 μm.

For example, the outer projections 37 may have the same pitch as the lenses 7 and have a convex shape different from the convex lens shape of the lenses 7.

In the above embodiment, a description is provided taking an example in which the outer projections 37 are formed so as to be formed in the same rectangular grid pattern as the lenses 7. However, the positioning of the outer projections 37 may be different from that of the lenses 7. For example, the outer projections 37 may be formed in a staggered pattern where rows of the outer projections 37 extending from the inner edge toward the outer edge are staggered by an amount less than a pitch of the outer projections 37 in the rows, or the outer projections 37 may be formed in a diagonal lattice pattern.

In the above embodiment, a description is provided taking an example in which the inner projections 17 are provided. However, the inner projections 17 may be omitted in the case where cracking in the outer edge of the lens 7 does not occur.

In the above embodiment, the shape of the outer projections 37 in plan view is described as being similar to a square or a circular as with the lenses 7. However, the outer projections 37 may include one or more dome-shaped, long, and narrow projections extending in one direction. In this case, the longitudinal direction of the one or more dome-shaped projections may be a direction substantially perpendicular to the outer edge of the fourth anti-reflection film portion 8*d*. In the above embodiment, a description is provided taking an example in which the filter module of the solid-state image sensor performs color separation of incident light into red color, green color, and blue color. However, color separation by the filter module is not limited to this. For example, the filter module may perform color separation of incident light into cyan, magenta, and yellow.

In the above embodiment, the solid-state image sensor 1 is described as being a color image sensor. However, the solid-state image sensor may be a monochrome image sensor. In this case, the filter module may be a filter other than a color filter, for example, an infrared cut-off filter.

Although a configuration is presented where the outer light-shielding layer 25 is disposed below (substrate side) the fourth anti-reflection film portion 8*d* as illustrated in FIG. 6, the outer light-shielding layer 25 may not necessarily be provided. That is, instead of the outer light-shielding layer 25, the same material as the second flattening layer 6 may be filled in a region corresponding to the fourth anti-reflection film portion 8*d*, and a blue colored layer may be provided in a region corresponding to the third anti-reflection film portion 8*c*.

Alternatively, instead of the outer light-shielding layer 25, a blue colored layer may be provided in the region corresponding to the fourth anti-reflection film portion 8*d*, and a red colored layer and a blue colored layer may be laminated in this order in the region corresponding to the third anti-reflection film portion 8*c*.

The outer projections 37 may have a rectangular shape. That is, although the cross-sectional shape of the outer projections 37 is a semicircular shape with a curved profile as illustrated in FIG. 6, the outer projections 37 may have a cross-sectional shape with a straight top side. Note that each two adjacent outer projections 37 has a trough therebetween.

A smaller radius of curvature is preferable for the curved surface of the protruding part 8*e* because compared to when the curved surface of the protruding part 8*e* has a larger radius of curvature, when designed to have a curved surface with a smaller radius of curvature, the protruding part 8*e* has a larger second moment of area and thus is less likely to break (become chipped).

Although the protruding part 8*e* is described above as having a curved shape, it may have a linear shape.

Although the protruding part 8*e* faces downward (semiconductor substrate 2 side) as illustrated in FIG. 14, it may face upward. Changing the size of the mask 50 allows production of the protruding part 8*e* that faces upward. Note that the protruding part 8*e* preferably faces downward because it is easier to withstand an external force applied thereto.

Some embodiments of the present invention have been described so far, but the present invention should not be limited to the embodiments described above. Additions, omissions, substitutions, and other changes are possible in the configurations without departing from the spirit of the present invention.

A solid-state image sensor according to an embodiment of the present invention prevents the outer edge of the anti-reflection film from peeling off, and a method for producing a solid-state image sensor according to an embodiment of the present invention produces such a solid-state image sensor efficiently.

A solid-state image sensor includes photoelectric conversion elements, filters, and lenses in this order over a substrate. The respective photoelectric conversion elements, filters, and lenses constitute imaging pixels and are formed at a central portion of the solid-state image sensor. An anti-reflection film is often formed on the surfaces of the respective lenses to improve imaging sensitivity. Such an anti-reflection film may be, for example, a thin film of inorganic material such as silicon dioxide and is prone to cracking when formed on lenses composed of resin material that has a higher coefficient of thermal expansion.

JP 2013-012518 A proposes a technique of providing a solid-state image sensor with projections composed of the same material as its microlenses such that the projections are disposed in an adjacent region adjoining a light-receiving effective region so as to surround this region and forming an anti-reflection film that uniformly covers the surfaces of the microlenses and projections.

The technique described in JP 2013-012518 A aims to prevent cracking from occurring in part of the anti-reflection film above those microlenses at the outer edge of the light-receiving effective region. However, the solid-state image sensor has a peripheral region located outside the above adjacent region, which has a wide area and no photoelectric conversion elements. Because part of the substrate in the peripheral region has formed thereon electrical wires connected to photoelectric conversion elements, a flat light-shielding layer is disposed over this part of the substrate to prevent reflection of incident light from an external light source.

The light-shielding layer has formed thereon a resin layer composed of the same material as the microlenses and covered by the anti-reflection film. After formation of the anti-reflection film, part of the resin layer in the peripheral region is removed by etching to expose the scribe lines and electrode pads of the solid-state image sensor. The outer edge of the peripheral region thus has an adjusted shape. This etching process erodes the side surface of the resin layer, resulting in part of the anti-reflection film protruding from the outer edge of the resin layer after etching. The protruding part of the anti-reflection film may, for example, be cracked or peel off during post-processing such as a cleaning process, possibly leading to defects in the solid-state image sensor.

Such damage to the anti-reflection film may be prevented by performing the etching process after forming a resin coating layer covering the outer edge of the anti-reflection film and a region outside this outer edge. In this case, as the etching proceeds, erosion of the resin layer occurs in part of it under a portion of the coating layer located farther than the outer edge of the anti-reflection film, and erosion of the resin layer is thus prevented in part of it under the anti-reflection film. However, this production method requires a step of forming the coating layer, which increases production time and thus poses the problem of increased production cost.

A solid-state image sensor according to an embodiment of the present invention includes an anti-reflection film with an outer edge that is prevented from peeling off. Also, a method for producing a solid-state image sensor according to an embodiment of the present invention efficiently produces such a solid-state image sensor.

A solid-state image sensor according to a first aspect of the present invention includes a substrate; photoelectric conversion elements positioned on the substrate; a filter module disposed above the photoelectric conversion elements such that light is transmitted through the filter module before being incident on the photoelectric conversion elements; lenses disposed above the filter module; a resin layer surrounding an outer edge of the filter module in plan view; and an anti-reflection film formed on the lenses and the resin layer, the anti-reflection film having a peripheral film portion that covers a peripheral portion of the resin layer in plan view, the peripheral film portion having an uneven shape that has unevenness in a thickness direction of the resin layer, at least part of an outer edge of the peripheral film portion protruding outside the resin layer.

The above solid-state image sensor may be structured such that the peripheral portion of the resin layer has an uneven surface having unevenness in the thickness direction; and the uneven shape of the peripheral film portion conforms to the uneven surface.

The above solid-state image sensor may be structured such that the uneven shape of the peripheral film portion includes upwardly projecting surface portions.

The above solid-state image sensor may be structured such that each of the upwardly projecting surface portions has a shape conforming to a corresponding one of upwardly convex lens surface shapes formed in the resin layer.

The above solid-state image sensor may be structured such that a light-blocking layer that absorbs external light is disposed between the substrate and the resin layer, the filter module includes colored layers, and at least part of the light-blocking layer is composed of a material identical to that of the colored layers.

The above solid-state image sensor may be structured such that a maximum amount of protrusion by which the at least part of the outer edge of the peripheral film portion protrudes outside the resin layer is 40% or more and 200% or less of a pixel size determined by a pitch at which the photoelectric conversion elements are positioned.

The above solid-state image sensor may be structured such that the uneven shape of the peripheral film portion includes projecting portions formed in rows such that two or more of the projecting portions of the uneven shape are aligned in each row in an inward direction from the outer edge of the resin layer.

The above solid-state image sensor may be structured such that the uneven shape of the peripheral film portion includes projecting portions formed at a pitch equal to a pitch at which the lenses are formed.

The above solid-state image sensor may be structured such that the anti-reflection film has an inner film portion on the lenses, and an intermediate film portion between the inner film portion and the peripheral film portion; and the intermediate film portion has a flat shape.

A method for producing a solid-state image sensor according to a second aspect of the present invention includes preparing a substrate that has formed thereon photoelectric conversion elements; forming a filter module above the photoelectric conversion elements such that the filter module covers the photoelectric conversion elements; forming a resin layer that surrounds an outer edge of the filter module in plan view; patterning the resin layer such that a surface of the resin layer has an uneven shape having unevenness in a thickness direction of the resin layer; forming an anti-reflection film on a surface of the patterned resin layer; and partially removing the anti-reflection film and the resin layer by etching the uneven shape entirely around peripheries of the anti-reflection film and the resin layer such that part of the anti-reflection film protrudes outside the resin layer.

A solid-state image sensor according to an embodiment of the present invention prevents the outer edge of the anti-reflection film from peeling off, and a method for producing a solid-state image sensor according to an embodiment of the present invention produces such a solid-state image sensor efficiently.

Obviously, numerous modifications and variations of the present invention are possible in light of the above teachings. It is therefore to be understood that within the scope of the appended claims, the invention may be practiced otherwise than as specifically described herein.

The invention claimed is:

1. A solid-state image sensor, comprising:

a substrate;

a plurality of photoelectric conversion elements positioned on the substrate;

a filter module positioned above the photoelectric conversion elements positioned on the substrate;

a plurality of lenses positioned above the filter module positioned above the photoelectric conversion elements;

a resin layer formed such that the resin layer is surrounding an outer edge of the filter module positioned on the substrate; and an anti-reflection film formed on the lenses and the resin layer such that the anti-reflection film has a peripheral film portion covering a peripheral portion of the resin layer and has a first portion covering the lenses, wherein the filter module is positioned such that light is transmitted through the filter module before being incident on the photoelectric conversion elements, and the anti-reflection film is formed such that the peripheral film portion has an uneven shape having unevenness in a thickness direction of the resin layer and at least part of an outer edge protruding outside the resin layer from the first portion covering the lenses.

2. The solid-state image sensor according to claim 1, wherein the peripheral portion of the resin layer has an uneven surface having unevenness in the thickness direction, and the anti-reflection film is formed such that the uneven shape of the peripheral film portion conforms to the uneven surface of the peripheral portion of the resin layer.

3. The solid-state image sensor according to claim 1, wherein the anti-reflection film is formed such that the uneven shape of the peripheral film portion comprises a plurality of upwardly projecting surface portions.

4. The solid-state image sensor according to claim 3, wherein each of the upwardly projecting surface portions has a shape conforming to a corresponding one of upwardly convex lens surface shapes formed in the resin layer.

5. The solid-state image sensor according to claim 1, further comprising:

a light-blocking layer formed between the substrate and the resin layer such that the light-blocking layer absorbs external light, wherein the filter module includes a plurality of colored layers, and at least part of the light-blocking layer includes a material identical to a material of the colored layers.

6. The solid-state image sensor according to claim 1, wherein the anti-reflection film is formed such that a maximum amount of protrusion by the at least part of the outer edge of the peripheral film portion protruding outside the resin layer is in a range of 40% to 200% of a pixel size determined by a pitch at which the photoelectric conversion elements are positioned.

7. The solid-state image sensor according to claim 1, wherein the anti-reflection film is formed such that the uneven shape of the peripheral film portion comprises projecting portions formed in rows such that at least two of the projecting portions are aligned in each row in an inward direction from the outer edge of the resin layer.

8. The solid-state image sensor according to claim 1, wherein the anti-reflection film is formed such that the uneven shape of the peripheral film portion comprises projecting portions formed at a pitch equal to a pitch at which the lenses are positioned.

9. The solid-state image sensor according to claim 1, wherein the anti-reflection film has an inner film portion on the lenses, and an intermediate film portion formed between the inner film portion and the peripheral film portion such that the intermediate film portion has a flat shape.

10. The solid-state image sensor according to claim 2, wherein the anti-reflection film is formed such that the uneven shape of the peripheral film portion comprises a plurality of upwardly projecting surface portions.

11. The solid-state image sensor according to claim 10, wherein each of the upwardly projecting surface portions has a shape conforming to a corresponding one of upwardly convex lens surface shapes formed in the resin layer.

12. The solid-state image sensor according to claim 2, further comprising:

a light-blocking layer formed between the substrate and the resin layer such that the light-blocking layer absorbs external light, wherein the filter module includes a plurality of colored layers, and at least part of the light-blocking layer includes a material identical to a material of the colored layers.

13. The solid-state image sensor according to claim 2, wherein the anti-reflection film is formed such that a maximum amount of protrusion by the at least part of the outer edge of the peripheral film portion protruding outside the resin layer is in a range of 40% to 200% of a pixel size determined by a pitch at which the photoelectric conversion elements are positioned.

14. The solid-state image sensor according to claim 2, wherein the anti-reflection film is formed such that the uneven shape of the peripheral film portion comprises projecting portions formed in rows such that at least two of the projecting portions are aligned in each row in an inward direction from the outer edge of the resin layer.

15. The solid-state image sensor according to claim 2, wherein the anti-reflection film is formed such that the uneven shape of the peripheral film portion comprises projecting portions formed at a pitch equal to a pitch at which the lenses are positioned.

16. The solid-state image sensor according to claim 2, wherein the anti-reflection film has an inner film portion on the lenses, and an intermediate film portion formed between the inner film portion and the peripheral film portion such that the intermediate film portion has a flat shape.

17. The solid-state image sensor according to claim 3, further comprising:

a light-blocking layer formed between the substrate and the resin layer such that the light-blocking layer absorbs external light, wherein the filter module includes a plurality of colored layers, and at least part of the light-blocking layer includes a material identical to a material of the colored layers.

18. The solid-state image sensor according to claim 3, wherein the anti-reflection film is formed such that a maximum amount of protrusion by the at least part of the outer edge of the peripheral film portion protruding outside the resin layer is in a range of 40% to 200% of a pixel size determined by a pitch at which the photoelectric conversion elements are positioned.

19. The solid-state image sensor according to claim 3, wherein the anti-reflection film is formed such that the uneven shape of the peripheral film portion comprises projecting portions formed in rows such that at least two of the projecting portions are aligned in each row in an inward direction from the outer edge of the resin layer.

* * * * *